United States Patent
Nishimura et al.

(10) Patent No.: US 6,465,781 B1
(45) Date of Patent: Oct. 15, 2002

(54) METHOD AND APPARATUS FOR INSPECTING OR MEASURING A SAMPLE BASED ON CHARGED-PARTICLE BEAM IMAGING, AND A CHARGED-PARTICLE BEAM APPARATUS

(75) Inventors: Norimasa Nishimura, Hadano; Akira Shimase, Yokosuka; Masahiro Watanabe, Yokohama; Asahiro Kuni, Tokyo; Taku Ninomiya, Hitachinaka; Hiroshi Miyai, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 17 days.

(21) Appl. No.: 09/589,065

(22) Filed: Jun. 8, 2000

(30) Foreign Application Priority Data

Jun. 11, 1999 (JP) .......................................... 11-165872

(51) Int. Cl.[7] .......................... G01N 23/00; G21K 7/00; H01J 40/00; H01J 47/00
(52) U.S. Cl. ........................ 250/306; 250/307; 250/308; 250/311; 250/305
(58) Field of Search ........................... 250/492.1, 492.2, 250/492.22, 306, 310, 311, 305, 307, 308

(56) References Cited

U.S. PATENT DOCUMENTS

| | | | | |
|---|---|---|---|---|
| 4,469,949 A | * | 9/1984 | Mori et al. | 250/491.1 |
| 4,810,879 A | * | 3/1989 | Walker | 250/305 |
| 4,877,964 A | * | 10/1989 | Tanaka et al. | 250/455.1 |
| 5,118,941 A | * | 6/1992 | Larson | 250/310 |
| 5,359,201 A | * | 10/1994 | Zertani et al. | 250/492.1 |
| 5,432,345 A | * | 7/1995 | Kelly | 250/306 |
| 5,444,242 A | * | 8/1995 | Larson et al. | 250/305 |
| 6,023,068 A | * | 2/2000 | Takahashi | 250/492.2 |

* cited by examiner

Primary Examiner—John R. Lee
Assistant Examiner—David A. Vanore
(74) Attorney, Agent, or Firm—Antonelli, Terry, Stout & Kraus, LLP

(57) ABSTRACT

A method and an apparatus for inspecting or measuring a sample based on charged-particle beam are provided to relieve charge-up of the sample, so that high-quality electron image is obtained. A UV light irradiation optical system is controlled by an irradiation controller, scanning of the charged-particle beam is controlled by a scanning controller, and the irradiation controller and the scanning controller are controlled by a general controller. They are mutually synchronized, and a signal from an electron detector is imaged by an image slicing circuit and an image processing circuit.

25 Claims, 20 Drawing Sheets

FIG. 6
OBJECTIVE IMAGE f3
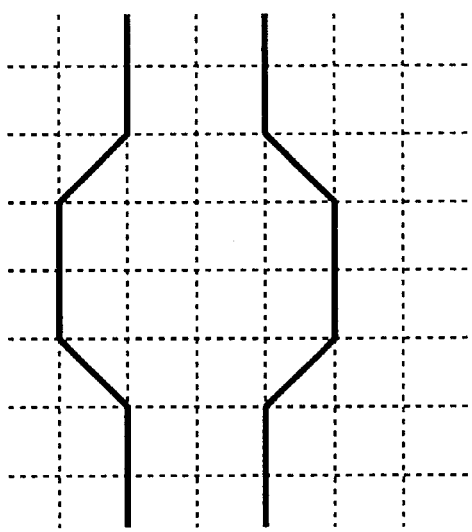
RELATIVE IMAGE g3
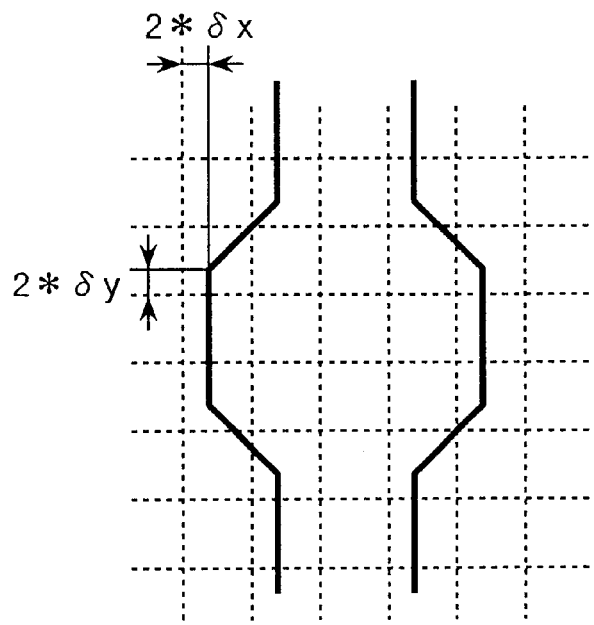

RESULT OF CELL
COMPARISON

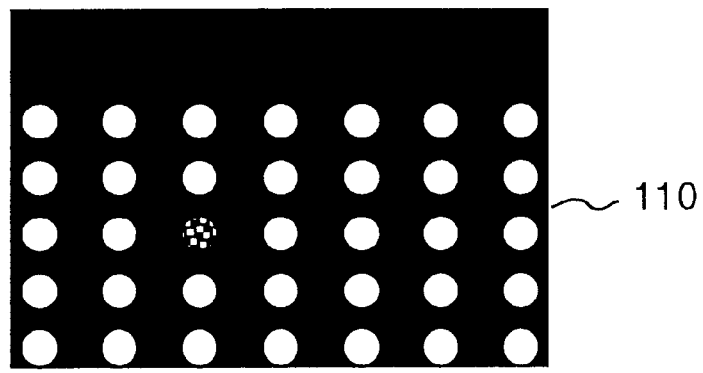
FIG. 11A ELECTRON BEAM IMAGE WITHOUT CHARGE-UP — 110
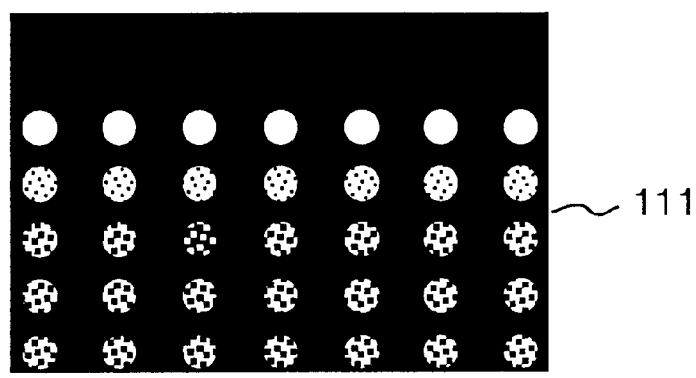
FIG. 11B ELECTRON BEAM IMAGE WITH LOCAL CHARGE-UP — 111
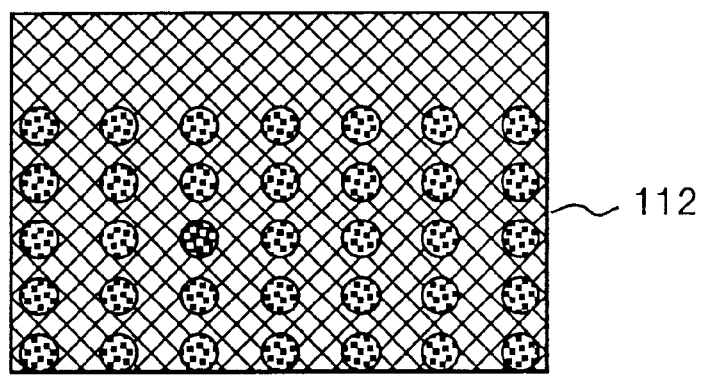
FIG. 11C ELECTRON BEAM IMAGE WITH WHOLE CHARGE-UP — 112

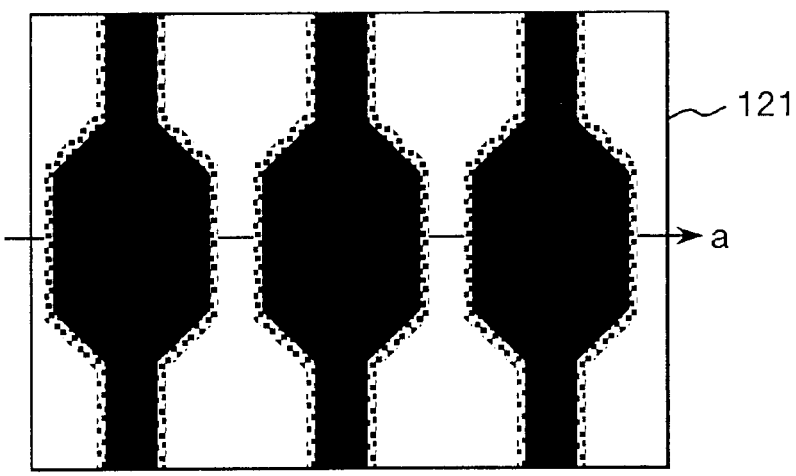
FIG. 13A
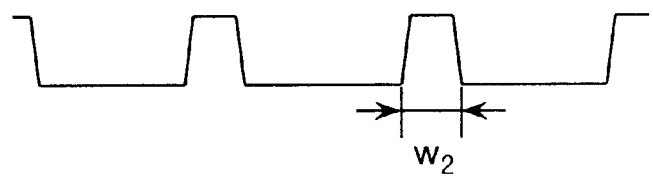
FIG. 13B
FIG. 14
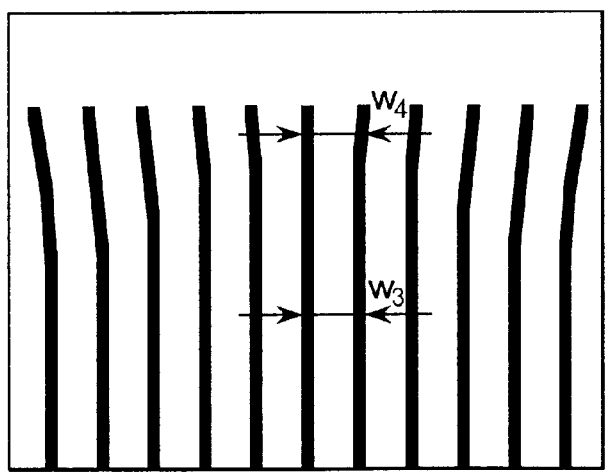

← STAGE MOVEMENT

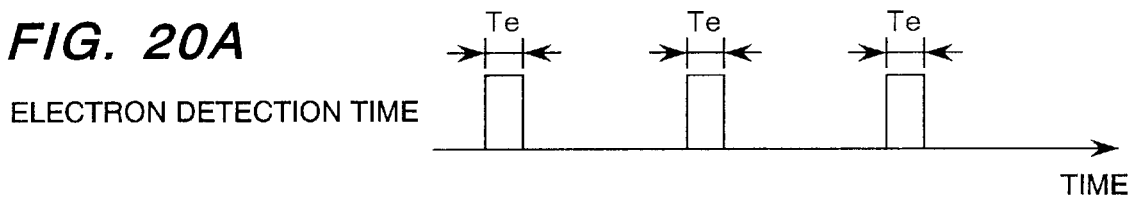
FIG. 20A
ELECTRON DETECTION TIME
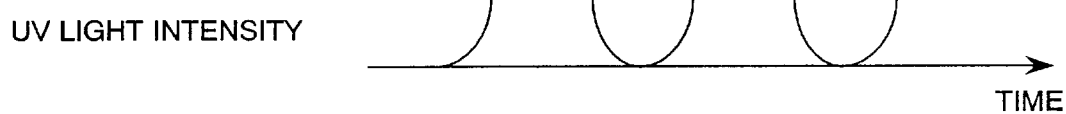
FIG. 20B
UV LIGHT INTENSITY
FIG. 21
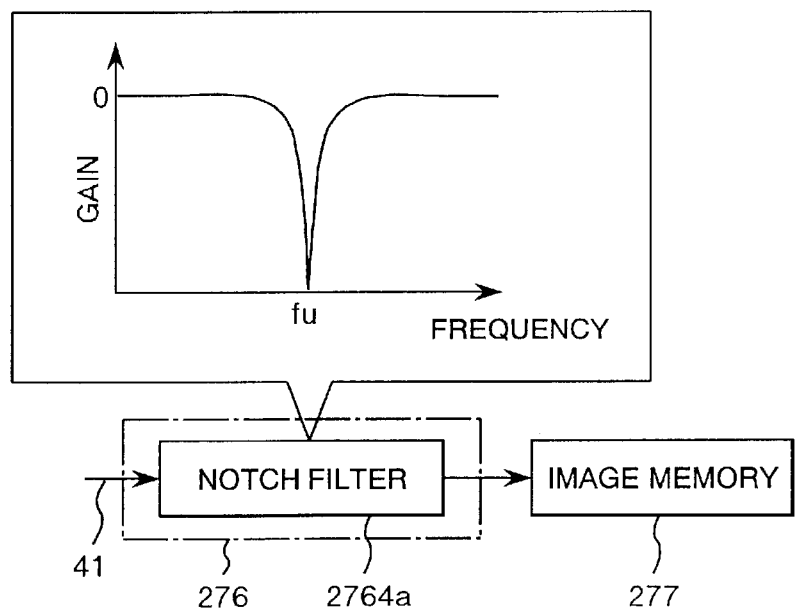

METHOD AND APPARATUS FOR INSPECTING OR MEASURING A SAMPLE BASED ON CHARGED-PARTICLE BEAM IMAGING, AND A CHARGED-PARTICLE BEAM APPARATUS

BACKGROUND OF THE INVENTION

The present invention relates to a charged-particle beam apparatus such as a scanning electron microscope, and to a method and apparatus for inspecting or measuring patterns on a semiconductor substrate or the like based on charged-particle beam imaging.

In recent years, wiring patterns formed on a semiconductor substrate or the like are becoming much smaller in dimensions. Therefore, it is necessary to detect extraneous substances or defects on fine patterns or measure the dimensions of fine patterns formed on a subject of inspection or measurement (will be termed "sample" hereinafter), e.g., a semiconductor substrate, based on the projection of a charged-particle beam, e.g., an electron beam, to the sample, the detection of charged particles, e.g., secondary electrons or reflected electrons, from the sample, and the processing of a signal derived from the detected charged-particles.

A sample of semiconductor substrate, which generally has the formation of an insulation film of $SiO_2$ or $Si_3N_4$ on at least part of its surface will be charged accidentally when a charged-particle beam, e.g., an electron beam, is projected to the surface.

Conventional techniques dealing with the above-mentioned matter are described in Japanese Laid Open Publication No.S63(1988)-133640 (prior art 1), No.H1(1989)-119668 (prior art 2), No.H1(1989)-243449 (prior art 3), and No.H4(1992)-152519 (prior art 4)

The prior art 1 is intended for electron beam testing by projecting an electron beam to a semiconductor sample and detecting secondary electrons released from the sample thereby to evaluate the potential at each position of the sample. It describes the prevention of charging by dispersing charges, which are accumulated on the sample surface due to the projection of electron beam, based on the photoconduction effect which is induced by the irradiation of light from a laser source or light source, e.g., a tungsten lamp, to the sample surface.

The prior art 2 is intended for an ion implant apparatus having an ion source, ion analyzer and accelerator. It describes the dissolution of impropriety (breakdown of a thin $SiO_2$ insulation film) caused by charge-up due to ion implantation based on the irradiation of the entire Si wafer surface coated with a $SiO_2$ insulation film with a ultraviolet (will be termed "UV" hereinafter) light from a low-voltage mercury lamp or ArF laser (with a wavelength of 193 nm) thereby to energize carriers in $SiO_2$, which is immediately followed by the lead-out of positive charges, which have been created by ion implantation, through a disc or clamp. Namely, the prior art 2 uses a UV light which passes through $SiO_2$ for putting energy on the border surface between Si and $SiO_2$.

The prior art 3 is intended for the sputtering process of a wiring modification point on a Si substrate, which has the formation of an insulation film on the surface, of a semiconductor device based on the projection of ion beam, and for the formation of W wires through holes, which have been formed by the sputtering process, based on the projection of ion beam in a gaseous atmosphere of $W(CO)^6$ or the like. It describes the neutralization of the insulation film surface by using electrons energized by the irradiation of UV light.

The prior art 4 is intended for the fabrication of a semiconductor device. It describes the process for charge-up of charged particles based on the irradiation of the semiconductor substrate surface with a UV light with a wavelength of 398–141 nm for a $SiO_2$ insulation film or 617.3–246.9 nm for a $Si_3N_4$ insulation film following a process, by which charges are accumulated in the semiconductor substrate, among dry etching, ashing, plasma CVD, electron beam exposure, ion implantation, pure water washing, and wafer SEM.

However, none of these prior arts 1 through 4 consider the prevention of the drift of charged-particle signal or the deterioration of contrast at the detection of charged-particles, e.g., secondary electrons or reflected electrons, from the sample of semiconductor substrate or the like caused by charges emerging on the insulator due to the projection of charged-particle beam to the sample surface, and none of the prior arts consider the avoidance of the influence of photoelectrons emerging at the irradiation of the insulator with a UV light.

Another problem which is left unconsidered in these prior arts 1 through 4 is the creation of burnt insulation substance due to the projection of a charged-particle beam, e.g., an electron beam, to the aperture, for example, within the barrel of a charged-particle beam apparatus, e.g., an electron beam apparatus, and the occurrence of charge-up due to the projection of charged-particle beam to the insulation substance, which results in a fluctuated beam position or spot diameter of the charged-particle beam, e.g., an electron beam, emitted from the barrel.

SUMMARY OF THE INVENTION

An object of the present invention is to provide a method and apparatus for inspecting or measuring a sample based on charged-particle beam imaging, with the foregoing prior art problems being overcome.

In order to achieve the above objective, the present invention resides in a method of inspecting or measuring a sample based on charged-particle beam imaging, the method comprising an inspecting or measuring step of projecting, while scanning, a converged charged-particle beam to a sample which has the formation of an insulation film on at least part of the surface thereof, detecting charged particles which are released from the sample due to the projection of scanning charged-particle beam, thereby producing a charged-particle image, and processing the produced charged-particle image, thereby performing the inspection or measurement of the sample, and a conduction rendering step of irradiating the sample with a UV light to make the insulation film conductive, thereby causing charges to flow out of the sample.

The present invention also resides in a method of inspecting or measuring a sample based on charged-particle beam imaging, the method projecting, while scanning, a converged charged-particle beam to a sample which has the formation of an insulation film on at least part of the surface thereof, detecting charged particles which are released from the sample due to the projection of scanning charged-particle beam, thereby producing a charged-particle image, processing the produced charged-particle image, thereby performing the inspection or measurement of the sample, and irradiating the sample with a UV light to energize electrons in the insulation film on the sample surface, thereby making the insulation film conductive.

The present invention also resides in an apparatus for inspecting or measuring a sample based on charged-particle beam imaging, the apparatus comprising a stage for placing a sample which has an insulation film, a charged-particle source, a charged-particle focusing system which converges the charged-particle beam emitted by the charged-particle source, a scanning means which deflects the charged-particle beam converged by the charged-particle beam focusing system to project, while scanning, the charged-particle beam to the sample placed on the stage, an imaging means which detects charged particles released from the sample due to the projection of charged-particle beam by the scanning means, thereby producing a charged-particle image, an image processing means which processes the charged-particle image produced by the imaging means, thereby performing the inspection or measurement of the sample, and a UV light irradiation means which irradiates the sample with a UV light to energize electrons in the insulation film, thereby making the insulation film conductive.

The present invention also resides in a charged-particle beam apparatus which comprises a stage for placing a sample which has an insulation film, a charged-particle source, a charged-particle focusing system which converges the charged-particle beam emitted by the charged-particle source, a scanning means which deflects the charged-particle beam converged by the charged-particle beam focusing system to project, while scanning, the charged-particle beam to the sample placed on the stage, a detector means which detects charged particles released from the sample due to the projection of charged-particle beam by the scanning means, an imaging means which produces a charged-particle image of the sample based on the signal of charged particles detected by the detector means, a barrel means which accommodates the stage, charged-particle source, charged-particle focusing system and detector means, and a UV light projection means which projects a UV light to the interior of the barrel means.

The inventive method and apparatus arranged as described above are designed to irradiate a sample with a UV light thereby to prevent the insulation film on the sample from being charged, so that an accurate and high-contrast charged-particle image which is rid of a noise component created by the UV light irradiation can be produced stably, thereby accomplishing the inspection of small extraneous substances and defects on fine patterns and the dimensional measurement of fine patterns at a high sensitivity and high reliability.

The inventive method and apparatus are designed to irradiate the sample of semiconductor substrate or the like with a UV light thereby to prevent the insulation film of $SiO_2$, $Si_3N_4$, etc. on the sample from being charged, while minimizing the adverse effect of UV light irradiation on underlying elements beneath the insulation film so that an accurate and high-contrast charged-particle image which is rid of a noise component created by the UV light irradiation can be produced stably, thereby accomplishing the inspection of small extraneous substances and defects on fine patterns and the dimensional measurement of fine patterns at a high sensitivity and high reliability.

The inventive method and apparatus are capable of preventing the fluctuation of the beam position, focal position and astigmatism of the charged-particle beam, e.g., an electron beam, caused by charge-up of the interior of the barrel of a charged-particle beam apparatus, e.g., an electron beam apparatus, thereby accomplishing the inspection of small extraneous substances and defects on fine patterns and the dimensional measurement of fine patterns at a high sensitivity and high reliability.

The inventive method and apparatus are capable of improving the efficiency of charged-particle beam emission from the charged-particle source, e.g., an electron gun, in the barrel of a charged-particle beam apparatus, e.g., an electron beam apparatus, thereby accomplishing a high-efficiency charged-particle beam apparatus.

These and other objects, features and advantages of the present invention will be apparent from the following more particular description of the preferred embodiments of the invention, as illustrated in the accompanying drawings.

BRIEF DESCRIPTION OF THE DRAWINGS

FIG. 6 is a set of diagrams used to explain the occurrence of a displacement within the dimension of pixel between an objective image f3 and a relative image g3 resulting from the operation of the image processing circuit shown in FIG. 5;

FIGS. 11A, 11B and 11C are diagrams used to explain the variation of image quantity caused by charge-up, showing an electron image in the absence of charge-up, an electron image with local charge-up, and an electron image with whole charge-up, respectively;

FIG. 13 is a diagram used to explain the variation of pattern dimension due to charge-up, showing an image for the measurement of line width of the case of a swelled line width caused by charge-up;

FIG. 14 is a diagram used to explain the variation of pattern dimension due to charge-up, showing imaged line widths which are different at positions resulting from the distortion of image;

FIGS. 20A and 20B are waveform diagrams used to explain the electron detection period which is controlled by the scanning controller of the case where the UV light intensity is varied;

FIG. 21 is a block diagram used to explain an embodiment for removing a noise component created by the irradiation of UV light with frequency fu from the detected electron image signal based on the use of a notch filter;

DESCRIPTION OF THE PREFERRED EMBODIMENTS

The inventive method and apparatus for inspecting or measuring a sample based on charged-particle beam imaging and the inventive charged-particle beam apparatus will be explained for their preferred embodiments with reference to the drawings.

Figure 1:
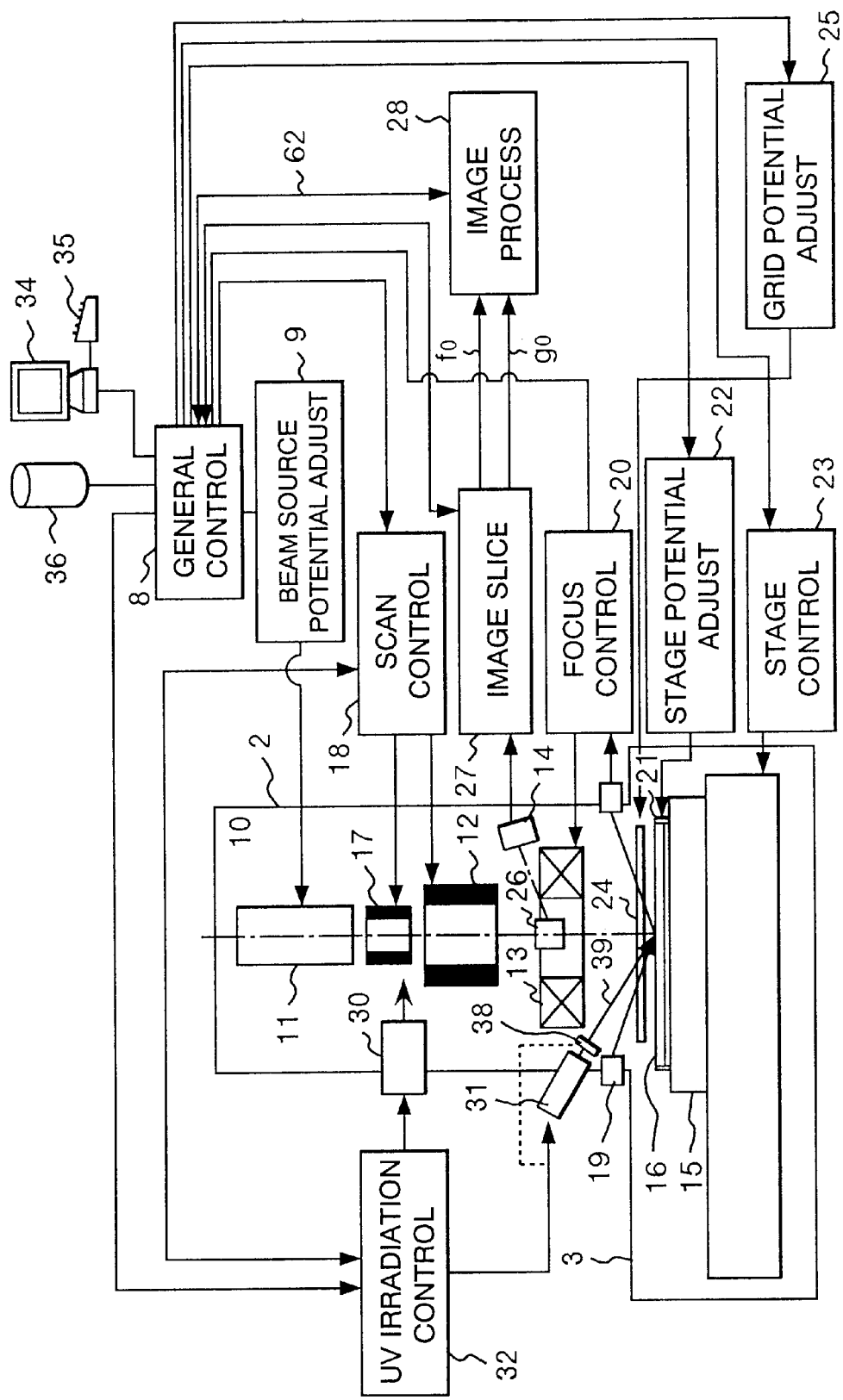
FIG. 1 is a block diagram showing the arrangement of an electron beam apparatus (inspection/measurement) apparatus based on electron beam imaging) which is an embodiment of the inventive charged-particle beam apparatus.

FIG. 1 shows the arrangement of an electron beam apparatus which is an embodiment of the charged-particle beam apparatus based on this invention. An electron beam apparatus 10 includes in the vacuum interior of a barrel 2 an electron beam source 11 having an electron gun which emits an electron beam, a condenser lens and a drawing electrode, a blanking mechanism 17 which turns on and off the projection of electron beam, a deflecting device 12 which deflects the electron beam, an electromagnetic lens 13 which focuses the electron beam on a sample 16, and an electron detector 14 for detecting electrons, e.g., secondary electrons or reflected electrons released from the sample 16, and further includes inside a vacuum chamber 3 an x/y table 15 on which is mounted a sample stage 21 for placing the sample 16, a position measuring device (not shown) for measuring the position of the x/y table 15 accurately, a grid electrode 24 disposed near the sample 16, and a height measuring device 19 for measuring the height of the sample 16.

The electron beam source 11 includes an electron gun of the thermal electric field radiation type which can have a large electron beam current. The deflecting device 12 includes a static deflector which can operate fast. The electron detector 14 for detecting electrons, e.g., secondary electrons or reflected electrons, is a semiconductor detector which can operate fast, and it is disposed over the objective lens 13 for example. The electron detector 14 has its output signal amplified by an amplifier 271 which is located outside the barrel 2. The height measuring device 19 consists of a laser irradiation optical system for projecting a laser beam in an oblique direction to the sample 16 and a detection optical system including a linear image sensor which detects the shift position of the reflected light from the sample surface.

The barrel 2 of the electron beam apparatus 10 further incorporates a UV light projection system 30 which projects a UV light into the barrel 2 for the purpose of preventing the contamination and charge-up of the barrel interior, and a UV light source 31 which irradiates the sample 16 with a UV light during the scanning of the electron beam thereby to discharge the sample 16.

The UV light source 31 can be an excimer lamp which energizes Ar gas to emit a UV light having a wavelength of 126 nm, anNd:YAG laser which produces the third harmonic light (e.g., VUV light of 118 nm), an $Ar_2$ excimer laser source (UV light of 126 nm), or a $Kr_2$ excimer laser source (UV light of 146 nm), and it is designed to irradiate the insulation film of $SiO_2$, $Si_3N_4$, etc. on the sample 16 of semiconductor substrate or the like with a UV light of 150 nm or less thereby to energize electrons in the valence band (filled band) in the insulation film to shift to the conduction band so that the electrons contribute to the electrical conduction (electronic conduction), thereby causing charges on the insulation film to flow out to the sample stage 21 having the application of a negative voltage.

The UV light source 31 can otherwise be a device which leads out a UV light of 150 nm or less by means of a spectroscope or the like from a plasma light source of Ar gas or the like.

The light source of the UV light projection system 30 can be a device similar to the light source 31. In case UV light source 31, particularly a laser source used for the UV light projection system 30, processes the insulation film or the like, it may be devised to manipulate the emitted UV laser beam to scan the sample or diffused with a diffusion plate of $MgF_2$, LiF, etc., thereby reducing the dose of laser irradiation.

The scanning controller (deflection signal generator) 18 responds to the electron beam scanning command from a general controller 8, which mainly consists of a CPU, to control the blanking mechanism (electrode) 17 to turn on and off the electron beam projection and control the deflecting device 12 to control the deflection of electron beam. The deflection signal generator 18 which issues the deflection signal to the deflecting device 12 modifies the signal so as to compensate the fluctuation of image magnification factor caused by the variation of the height of the sample surface and also compensate the image rotation caused by the control of the electromagnetic lens 13.

A focal position controller 20 controls the electromagnetic lens 13 in accordance with data of sample surface height which is detected by the height measuring device 19 at a certain position on the sample prior to the issuance of the electron beam scanning command from the general controller 8 so that the electron beam focuses on the sample 16. The focal position controller 20 may be designed to control the height of the x/y table 15 instead of controlling the focal position directly.

A beam source potential adjusting device 9 adjusts the potential of the electron beam source 11 in accordance with the potential adjusting command from the general controller 8. A grid potential adjusting device 25 adjusts the potential of the grid electrode 24, which is virtually the ground voltage, in accordance with the potential adjusting command from the general controller 8. A sample stage potential adjusting device 22 adjusts the negative potential of the sample stage 21 in accordance with the potential adjusting command from the general controller 8. These beam source potential adjusting device 9, grid potential adjusting device 25 and sample stage potential adjusting device 22 adjust the potential of the electron beam source 11, grid electrode 24 and sample stage 21, respectively, so that the electron beam detecting condition varies, thereby controlling the image quality, such as the contrast, of the produced image.

A stage controller 23 controls the movement of the x/y table 15 based on the positional feedback in accordance with the command from the general controller 8.

The electron beam emitted by the electron beam source 11 is converged by the condenser lens (not shown) in the electron beam source 11 and the electromagnetic lens (objective lens) 13 to have a beam diameter comparable with the pixel size on the sample surface and projected in the focused state to the sample surface. At this time, a negative voltage is applied to the sample 16 through the sample stage 21, with the grid electrode 24 being kept at virtually the ground voltage, so that the electron beam is decelerated on the path between the objective lens 13 and the sample 16, thereby enhancing the resolution of image in the low acceleration voltage range.

The sample 16 which undergoes the electron beam projection releases electrons. The electron detector 14 detects electrons released from the sample 16 in synchronism with the cyclic scanning in the x direction of the electron beam by the deflecting device 12 and the continuous movement in the y direction of the sample 16 on the x/y table 15, thereby producing a two-dimensional electron image of the sample.

In regard to the retarding scheme, a potential distribution is formed by the grid electrode 24 and the electrode of sample stage 21 so as to lower the effective acceleration voltage. In this case, if the potential distribution is constant regardless of the position of inspection or measurement of the sample 16 which is moved by the x/y table 15, there will arise no static distortion. This is only feasible by the provision of electrodes (grid electrode 24 and sample stage electrode 21) having infinite size. Due to finite sizes of the electrodes, it is difficult for the retarding scheme to make a constant magnetic field distribution throughout the sample surface. If there is no static distortion defined at the central section of the sample, then there is a static distortion at the edge section. The distorted magnetic field distribution over the sample causes the electron beam scanning to fluctuate, resulting in a static distortion emerging in the produced image.

For coping with this matter, prior to the inspection or measurement of a sample, a reference sample having a known dimension, shape and repetitive pattern is placed on the sample stage 21 and put on the x/y table 15, the image of this reference sample provided by the image slicing circuit 27 is stored in an image memory 277 (see FIG. 2) for example, and the distortion of the produced image is measured by the CPU of the general controller 8 for example. At the actual sample inspection or measurement, the general controller 8 operates on the scanning controller 18 with reference to the stored distortion data to control the scanning path (x/y coordinates) and the scanning speed of the electron beam so that the static distortion of the detected image is corrected.

Figure 2:
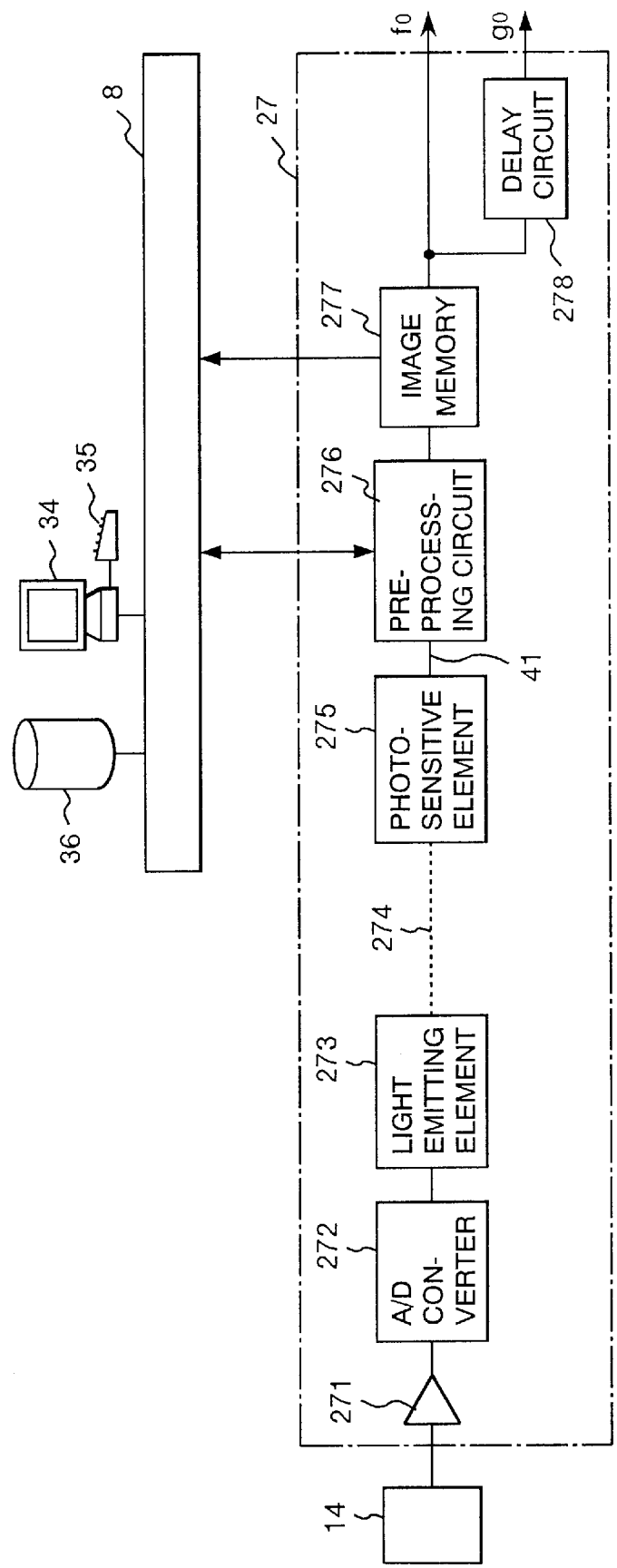
FIG. 2 is a block diagram showing the arrangement of an embodiment of the image slicing circuit shown in FIG. 1.

The image slicing circuit 27 as shown in FIG. 2, includes an amplifier 271 which amplifies the electron detection signal provided by the electron detector 14, an A/D converter 272 which converts the electron detection signal amplified by the amplifier 271 into digital image data (multi-tone image signal), a photo-conversion means (light emitting element) 273 which converts the output of the A/D converter 272 into an optical signal, a transmission means (optical fiber cable) 274 which transmits the optical signal provided by the photo-conversion means 273, an electro-conversion means (photosensitive element) 275 which converts the optical signal transmitted by the transmission means 274 back to digital image data, a preprocessing circuit (image correcting circuit) 276 which implements the preprocessing (image correction) for the digital image data (multi-tone image signal) provided by the electro-conversion means 275, an image memory 277 which stores temporarily the digital image data corrected by the preprocessing circuit 276, and a delay circuit 278 which delays the digital image data, i.e., objective image data, (multi-tone image signal) f0 read out of the image memory 277 by a prescribed time length thereby to produce a relative image data (multi-tone image signal) g0.

The reason for the transmission in the form of an optical signal is that for leading electrons from the reflector 26 to the semiconductor detector 14, the devices from the semiconductor detector 14 up to the photo-conversion means 273 (semiconductor detector 14, A/D converter 272 and photo-conversion means 273) need to be floated at a high positive voltage. In consequence, the image signal having a high positive potential level at the output of the photo-conversion means 273 is fed through the transmission means 274 of a high insulation material and obtained as an image signal of the ground level at the output of the electro-conversion means 275.

Figure 3:
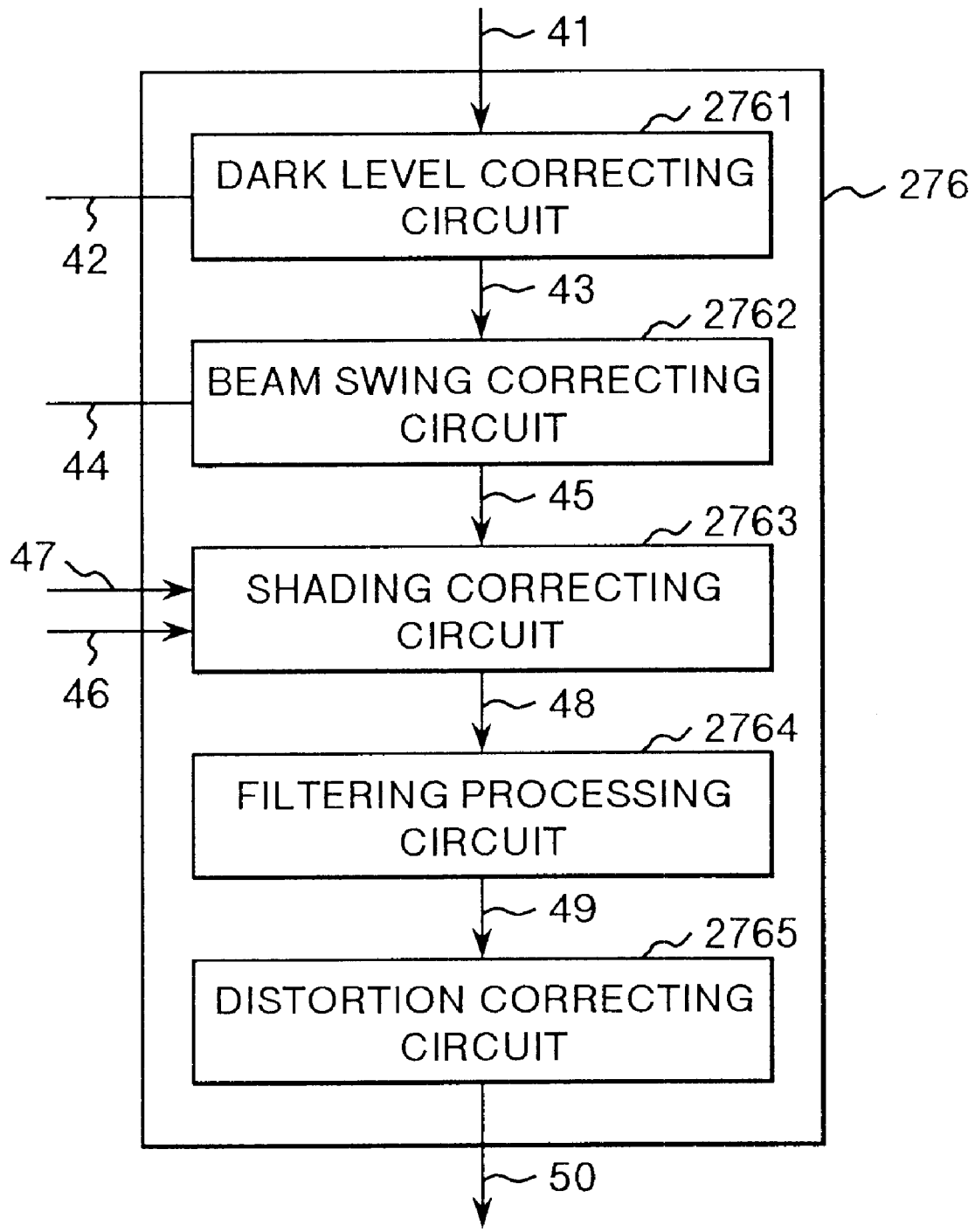
FIG. 3 is a block diagram showing the arrangement of an embodiment of the preprocessing circuit shown in FIG. 2;.

In the preprocessing circuit 276, as shown in FIG. 3, the digital image data (multi-tone image signal) provided by the photosensitive element 275 undergoes the dark level correction by a dark level correcting circuit 2761, the electron beam current swing correction by a electron beam swing correcting circuit 2762, the shading correction by a shading correcting circuit 2763, and the filtering process by a filtering process circuit 2764 with a Gaussian filter, averaging filter, edge emphasizing filter, etc. so that the image quality is improved.

The digital image data, when necessary, further undergoes the correction of static distortion of image by a distortion correcting circuit 2765, and resulting data is stored in the two-dimensional image memory 277. The distortion correcting circuit 2765 corrects the anticipated static distortion of the detected image based on a prepared formula of correction between coordinates (x,y) and (X,Y) of pixels before and after the correction.

Figure 4:
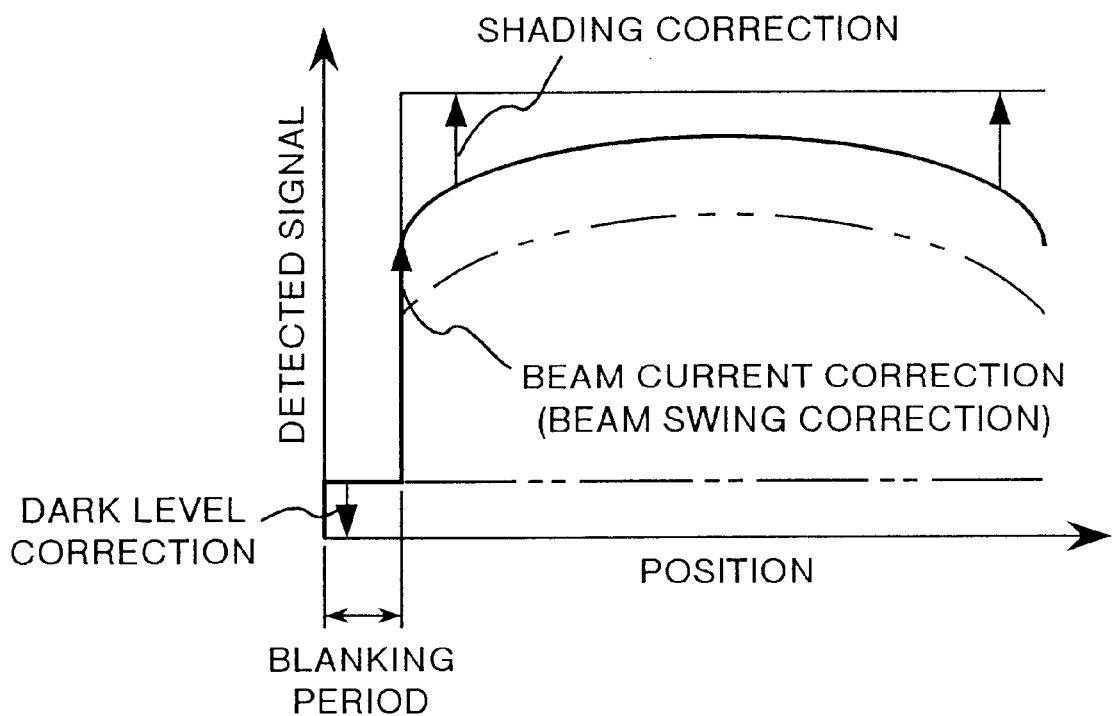
FIG. 4 is a graph used to explain various correction implemented by the preprocessing circuit shown in FIG. 3.

The dark level correcting circuit 2761 implements the dark level correction as shown in FIG. 4 based on the reference image signal 41 extracted by the photosensitive element 275 during the beam blanking period in response to the scanning line sync signal 42 provided by the general controller 8. The reference signal of dark level correction has the definition of dark level which is, for example, the average tone level of certain pixels at certain positions during the beam blanking period, and it is revised for each scanning line. In this manner, the dark level correcting circuit 2761 corrects the dark level of image signals detected during the beam blanking period based on the revised reference signals of individual lines. At the calculation of dark level, it is necessary to halt the output of UV light from the UV light source 31 or block the UV light to the sample 16 with a light blocking means 38 so as to prevent the creation of a noise component (dark level) by photo-electrons attributable to the UV light irradiation. This is the case where the sample 16 is not irradiated with the UV light from the UV light source 31 during the blanking period or during the period when the scanning electron beam is projected to the area of inspection or measurement.

Subsequently, the electron beam swing correcting circuit 2762 normalizes the image signal 43, which has been rendered the dark level correction, in accordance with the beam current 44 detected by a Faraday cup (not shown) at a certain correction interval (e.g., for every 100 kHz line) as shown in FIG. 4. The swing of electron beam does not vary quickly, and therefore a beam current which has been detected one or a few lines earlier can be used.

Subsequently, the shading correcting circuit 2763 corrects the light level variation at beam scanning positions 46 provided by the general controller 8 for the image signal 45 which has been rendered the electron beam swing correction. Specifically, the shading correction is the correction (normalization) of each pixel based on the reference brightness data 47 which has been detected in advance. The reference data 47 for shading correction is detected by turning off the shading correcting function, stored temporarily in a memory (e.g., image memory 277), and thereafter processed on a software basis with a computer in the general controller 8 or other high-ranking computer.

The image memory 277 is used to assess the protective state of the barrel interior from the contamination and charge-up based on the projection of UV light from the UV light projection system 30 and the state of optimum of the image signal, which is detected in a discharged state of the sample 16 by the irradiation of UV light from the UV light source 31 simultaneously with the electron beam scanning, to be delivered by the general controller 8 to a display means 34 or the like.

Figure 8:
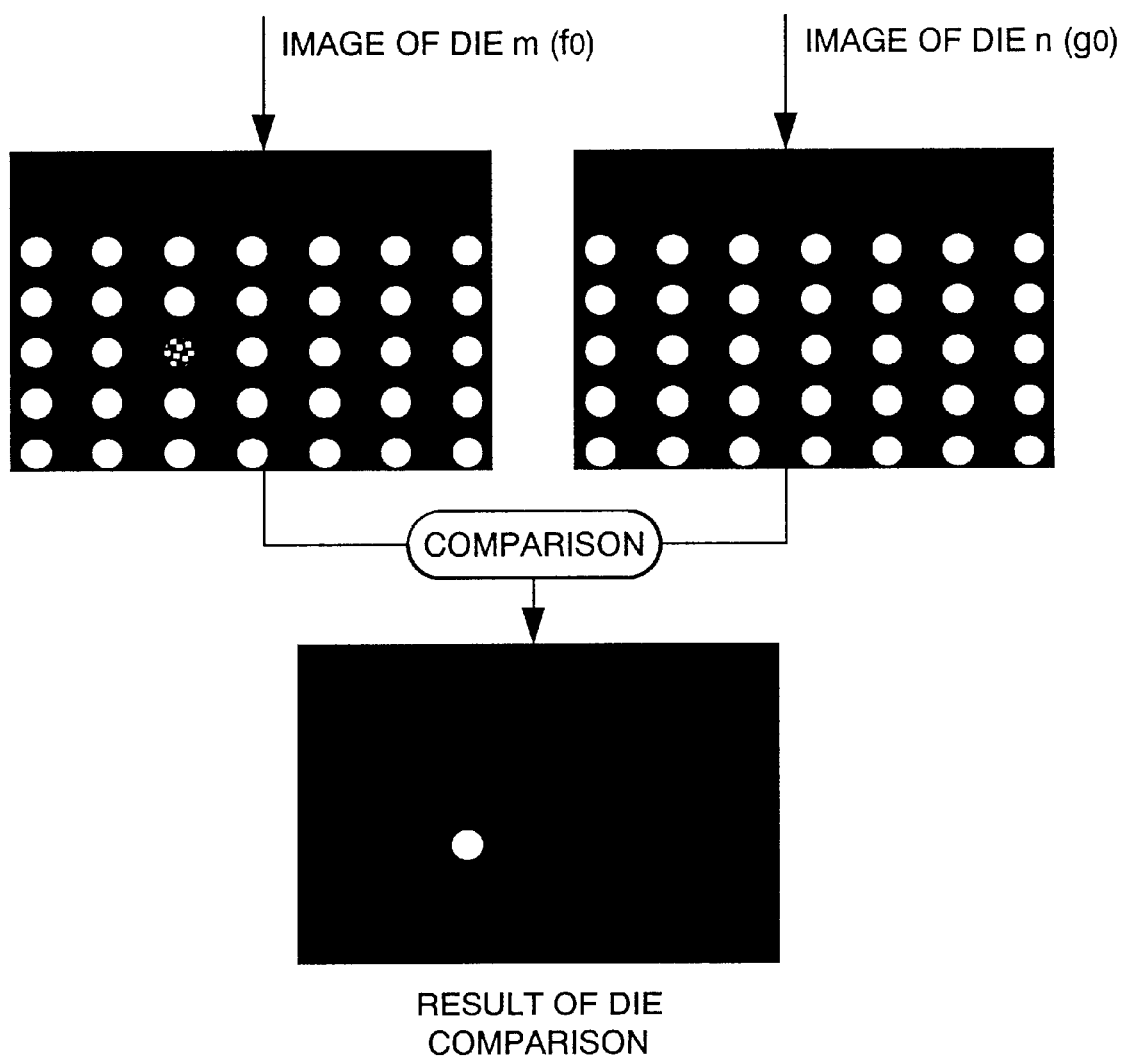
FIG. 8 is a diagram used to explain the comparative inspection of dies (chips)
Figure 9:
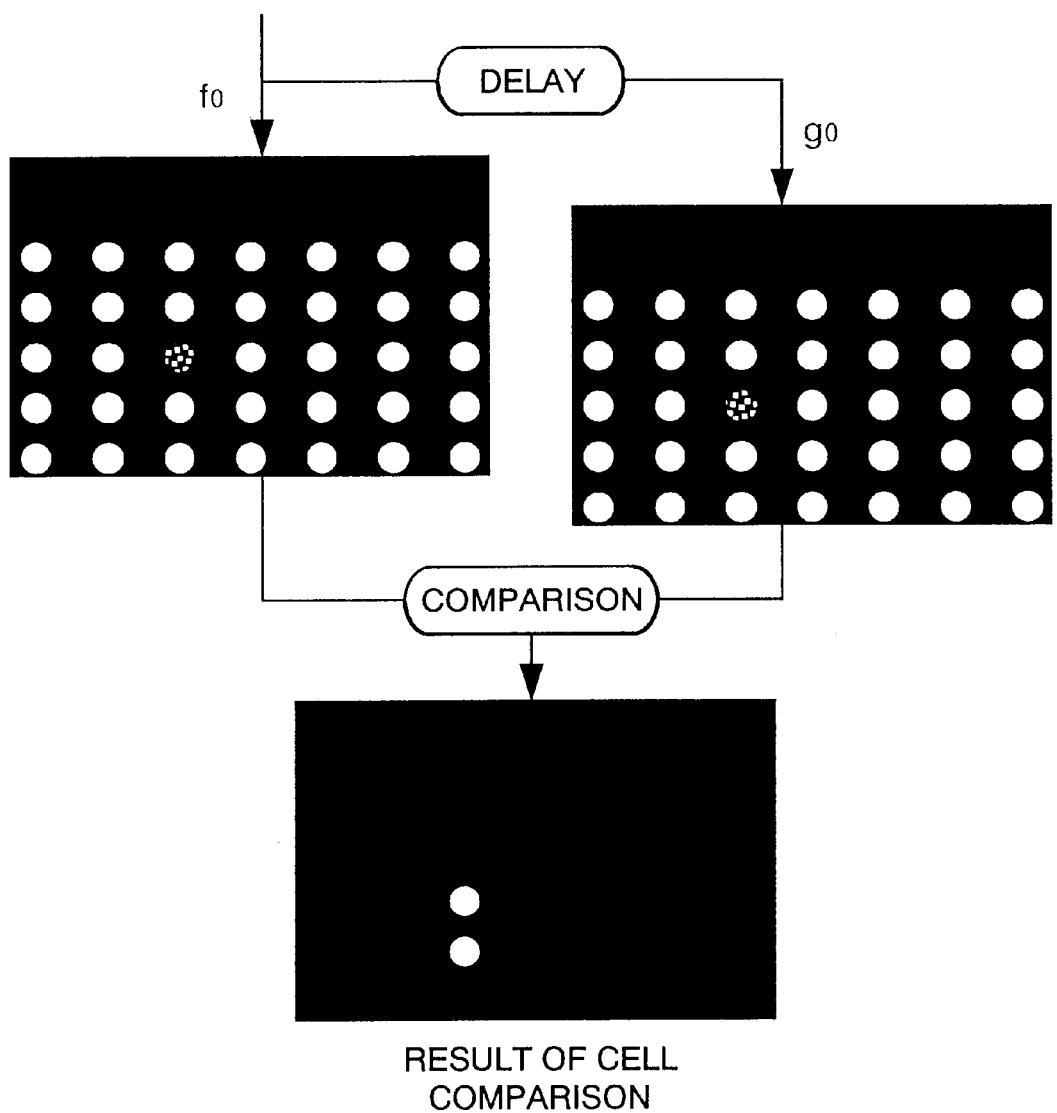
FIG. 9 is a diagram used to explain the comparative inspection of cells.

The delay circuit 278 which mainly consists of a shift register delays the digital image data (multi-tone image signal), which has been rendered the image correction by the preprocessing circuit 276, by a certain time length instructed by the general controller 8. For example, when the delay time is set to be the time taken by the table 15 to move by an amount of the chip pitch, image g0 of chips (dies) n of a delayed image signal coincides with adjacent image f0 of chips (dies) m of a non-delayed image signal as shown in FIG. 8, which enables the comparative chip inspection. Alternatively, when the delay time is set by being instructed by the general controller 8 to be the time taken by the table 15 to move by an amount of the pitch of memory cell, a delayed signal g0 coincides with a non-delayed signal f0 at adjacent memory cells as shown in FIG. 9, which enables the comparative memory cell inspection. In this manner, the delay circuit 278 is designed to select a delay time based on the control of pixel reading position by being instructed by the general controller 8, and the image slicing circuit 27 provides digital objective and relative image data (multi-tone image signals) f0 and g0 to be compared. The relative image signal g0 may be a cell image or chip (die) image selected within the sample, or may be a synthesized image based on design information.

An image processing circuit 28 has a function of setting a read-out area based on the specified address provided by the general controller 8, and it includes two-dimensional image memories 60a and 60b for storing the continuous objective image signal f0 and continuous relative image signal g0, a displacement detector 281, image memories 61a and 61b for storing the objective image signal f4 and relative image signal g4, a defect discriminater 282, and a defect editor 283.

The displacement detector 281 consists of an image registering circuit 2811 with a resolution of pixel size, a tone correcting circuit 2812 and a less-than-pixel displacement detecting circuit 2813 which detects a displacement smaller than the pixel size. The image registering circuit 2811 produces an objective image signal f2 and relative image signal g2 by shifting the position of the relative image signal g1(x,y), for example, such that the displacement of the relative image signal g1(x,y) with respect to the objective image signal f1(x,y of each area, which is sliced in a size of unit area with a negligible dynamic distortion (distortion caused by the variation of magnetic field due to the vibration of table 15 or pattern distribution on the sample) out of the two-dimensional image memories 60a and 60b, is within one pixel size, or in other words the position of the maximum degree of matching of f1(x,y) and g1(x,y) is within one pixel.

The tone correcting circuit 2812 corrects the tone values of the objective image signal f2 and relative image signal g2 following the registering of pixels for each area by the image registering circuit 2811. Accordingly, the image signals f1 and g1 which have had different mean values and standard deviations of tone values at the time of input to the tone correcting circuit 2812 become image signals f3 and g3 having an equal mean value and standard deviation of tone value by the process of the tone correcting circuit 2812.

The displacement detecting circuit 2813 calculates the displacement value (it is represented by a real number between 0 and 1) below the pixel size across the unit area. A displacement below the pixel size across the unit area is the situation as shown in FIG. 6. In the figure, each square defined by dotted lines indicates a pixel, which is the unit of detection by the electron detector 14, the unit of sampling by the A/D converter 272, and the unit of conversion into a digital value (tone value). The relative image g3 across a unit area is displaced by 2*δx in the x direction and 2*δy in the y direction relative to the objective image f3 across the unit area. Shown in this figure is an example in which the degree of matching is evaluated in terms of the sum of the square of difference ($\Sigma\Sigma(f3-g3)^2$).

The mid position between the objective image f1(x,y) of the unit area and the relative image g1(x,y) of the unit area is defined to have displacement 0. Accordingly, in the situation shown in FIG. 6, the f3 is assumed to have a displacement of −δx and −δy in the x and y directions, and the g3 is assumed to have a displacement of +δx and +δy in the x and y directions. Since δx and δy are not integers, it is necessary to define values of distance between pixels in order to make a displacement of δx and δy.

An objective image f4 of the unit area resulting from a shift of the objective image f3 of the unit area by +δx and +δy in the x and y directions, and a relative image g4 of the unit area resulting from a shift of relative image g3 of the unit area by −δx and −δy in the x and y directions are defined by the following formulas.

$$f4(x, y)=f3(x+\delta x, y+\delta y) \quad (1)$$

$$g4(x, y)=g3(x-\delta x, y-\delta y) \quad (2)$$

These formulas (1) and (2) are of the linear interpolation. The degree of matching e3(δx, δy) between the f4 and g4 in terms of the sum of the square of the difference is given by the following formula.

$$e3(\delta x, \delta y)=\Sigma\Sigma(f4(x, y)-g4(x, y))^2 \quad (3)$$

The symbol $\Sigma\Sigma$ signifies the summation in the unit area. The role of the less-than-pixel displacement detecting circuit 2813 is to evaluate δx0 and δy0 that give the minimum value of e3(δx, δy). The value δx0 and δy0 are obtained by partially differentiating the formula (3) by δx and δy, and solving the resulting formulas by setting them to be zero for δx and δy. In this manner, the displacement detecting circuit 2813 evaluates displacement values δx0 and δy0 below the pixel size for the unit area.

The delay circuits 61a and 61b formed of shift registers are intended to delay the pixel signals f3 and g3 for a time length which is needed for the less-than-pixel displacement detecting circuit 2813 to evaluate the δx0 and δy0.

Figure 5:
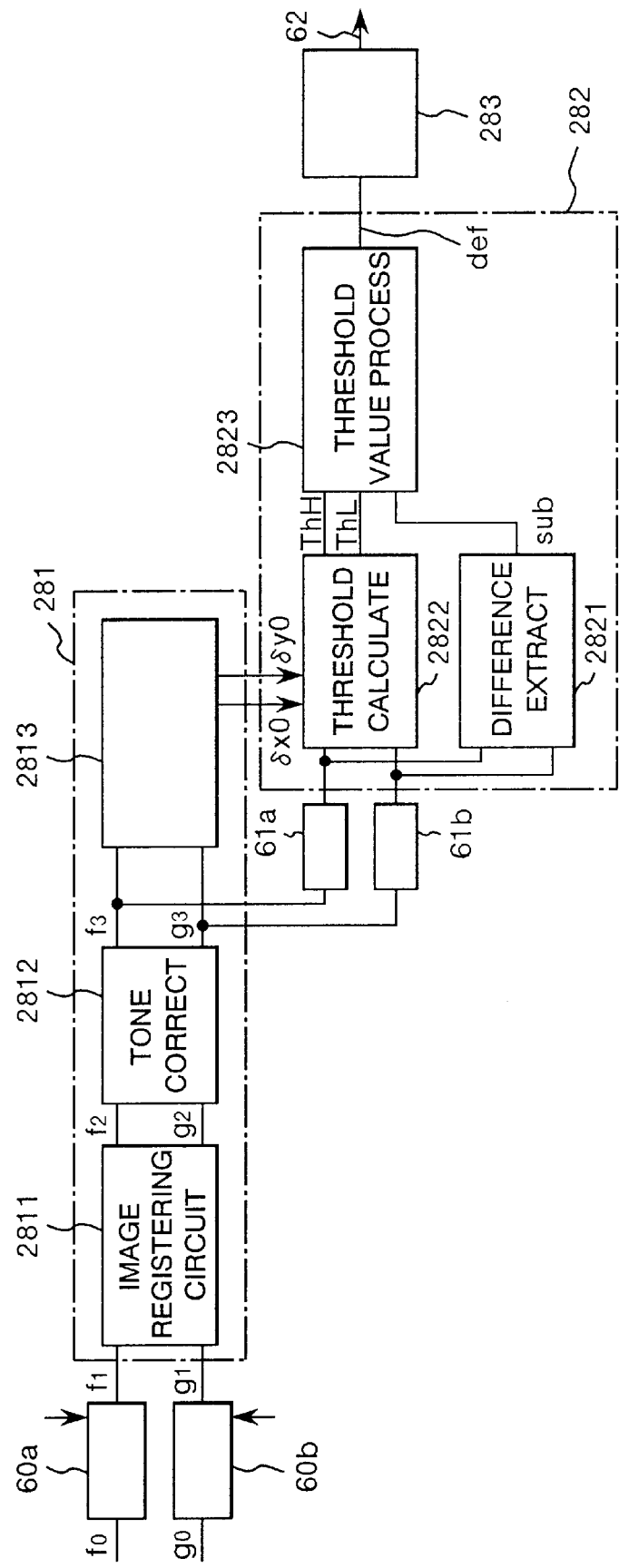
FIG. 5 is a block diagram showing the arrangement of an embodiment of the image processing circuit shown in FIG. 1.

Next, the defect discriminater 282 shown in FIG. 5 will be explained. The defect discriminater 282 includes a differential image extracting circuit 2821 which produces a differential image between the objective image f3 of each unit area and the relative image g3 of each unit area, and a threshold value processor 2823 which compares the tone value of the differential image with the threshold values thereby to discriminate a defect. Specifically, the differential image extracting circuit 2821 produces a differential image sub(x,y) of each unit area between the objective image f3 of each unit area and the relative image g3 of each unit area having a theoretical displacement of 2*δx0 and 2*δy0. The differential image sub(x,y) of each unit area is expressed as follows.

$$\mathrm{sub}(x, y) = g3(x, y) - f3(x, y) \tag{4}$$

A threshold value calculating circuit 2822 calculates two threshold values thH(x,y) and thL(x,y) of each unit area for the discrimination of a candidate defect by using the images f3 and g3 of each unit area provided through the delay circuit 61 and the displacement values δx0 and δy0 less than pixel of each unit area provided by the less-than-pixel displacement detecting circuit 2813.

Figure 7:
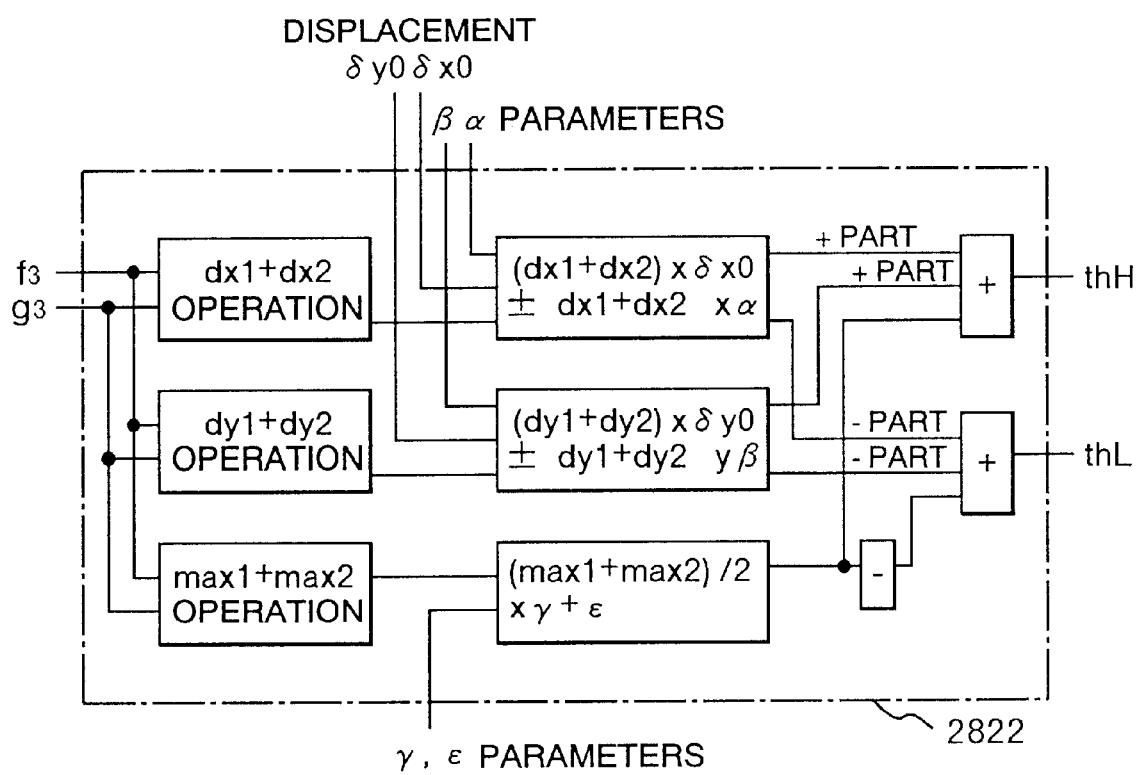
FIG. 7 is a block diagram showing a specific arrangement of the threshold value calculating circuit shown in FIG. 5.

The threshold values thH(x,y) and thL(x,y) define the upper limit and lower limit, respectively, of the differential image sub(x,y) obtained for each unit area. The threshold value calculating circuit 2822 which is arranged as shown in FIG. 7 implements the following calculations.

$$thH(x, y) = A(x, y) + B(x, y) + C(x, y) \tag{5}$$

$$thL(x, y) = A(x, y) - B(x, y) - C(x, y) \tag{6}$$

The term A(x,y) is to modify the threshold values by using the displacement values δx0 and δy0 less than pixel obtained for each unit area depending on the value of differential image sub(x,y) which is obtained substantially for each unit area, and it is expressed by the following formula (7). The term B(x,y) is to allow for a small displacement at the pattern edge (a small difference of pattern shape and a small distortion of pattern can be treated as a small displacement at the pattern edge) between the objective image f3 obtained for each unit division and the relative image g3 obtained for each unit division, and it is expressed by the following formula (8). The term C(x,y) is to allow for a small difference of tone values between the objective image f3 obtained for each unit area and the relative image g3 obtained for each unit area, and it is expressed by the following formula (9).

$$A(x, y) = \{dx1(x, y)^*\delta x0 - dx2(x, y)^*(-\delta x0)\} + \{dy1(x, y)^*\delta y0 - dy2(x, y)^*(-\delta y0)\} = \{dx1(x, y) + dx2(x, y)\}^*\delta x0 + \{dy1(x, y) + dy2(s, y)\}^*\delta y0 \tag{7}$$

$$B(x, y) = |\{dx1(x, y)^*\alpha - dx2(x, y)^*(-\alpha)\}| + |\{dy1(x, y)^*\beta - dy2(x, y)^*(-\beta)\}| = |\{dx1(x, y) + dx2(x, y)\}^*\alpha| + |\{dy1(x, y) + dy2(x, y)\}^*\beta| \tag{8}$$

$$C(x, y) = ((\mathrm{max}1 + \mathrm{max}2)/2)^*\gamma + \epsilon \tag{9}$$

where α and β are real numbers ranging 0–0.5, γ is a real number greater than 0, and ε is an integer greater than 0.

The term dx1(x,y) indicates the variation of tone value of the objective image f3(x,y) obtained for each unit area from the adjacent image in the +x direction, and it is expressed by the following formula (10).

$$dx1(x, y) = f3(x+1, y) - f3(x, y) \tag{10}$$

The term dx2(x,y) indicates the variation of tone value of the relative image g3(x,y) obtained for each unit area from the adjacent image in the −x direction, and it is expressed by the following formula (11).

$$dx2(x, y) = g3(x, y) - g3(x-1, y) \tag{11}$$

The term dy1(x,y) indicates the variation of tone value of the objective image f3(x,y) obtained for each unit area from the adjacent image in the +y direction, and it is expressed by the following formula (12).

$$dy1(x, y) = f3(x, y+1) - f3(x, y) \tag{12}$$

The term dy2(x,y) indicates the variation of tone value of the relative image g3(x,y) obtained for each unit area from the adjacent image in the −y direction, and it is expressed by the following formula (13).

$$dy2(x, y) = g3(x, y) - g3(x, y-1) \tag{13}$$

The term max1 indicates the maximum tone value among the objective image f3(x,y) obtained for each unit area and the adjacent images in th +x direction and +y direction, and it is expressed by the following formula (14). The term max2 indicates the maximum tone value among the relative image g3(x,y) obtained for each unit area and the adjacent images in the −x direction and −y direction, and it is expressed by the following formula (15).

$$\mathrm{max}1 = \mathrm{max}\{f3(x, y), f3(x+1, y), f3(x, y+1), f3(x+1, y+1)\} \tag{14}$$

$$\mathrm{max}2 = \mathrm{max}\{g3(x, y), g3(x-1, y), g3(x, y-1), g3(x-1, y-1)\} \tag{15}$$

The parameters α, β, γ and ε to be given to the threshold value calculating circuit 2822 are preferably prepared in advance in a file for each type of sample 16 (type of wafer, process, etc.) and stored in the memory 36 associated with the general controller 8, for example, so that the file is loaded to the general controller 8 and fed to the threshold value calculating circuit 2822 automatically in response to the input of the type of sample at the beginning of inspection.

The threshold value processor 2823 uses the differential image sub(x,y) of each unit area provided by the a differential image extracting circuit 2821 and the upper and lower threshold values thH(x,y) and thL(x,y) of each unit area provided by the threshold value calculating circuit 2822 to discriminate a pixel at position (x,y) in a unit area to be a non-defect candidate or a defect candidate depending on whether or not the following formula (16) is met. The threshold value processor 2823 produces for a unit area a bi-level image def(x,y) in which non-defect candidate pixels have value 0 and defect candidate pixels have value 1.

$$thL(x, y) \leq \mathrm{sub}(x, y) \leq thH(x, y) \tag{16}$$

The defect editor 283 implements the noise eliminating process (e.g., the process of reduction and expansion for a bi-level image def(x,y). For example, if 3-by-3 pixels are not defect candidate pixel simultaneously, the reduction process is carried out to eliminate pixels by making the central pixel to be 0 (non-defect candidate pixel), for example, and then the expansion process is carried out to restore the image) thereby to remove a noise-like output (e.g., no defect candidate pixels exist simultaneously throughout the 3-by-3 pixels), and thereafter implements the process of merging the neighboring defect candidate portion. Subsequently, the defect editor 283 calculates characteristic values 62 such as the centroid coordinates, x/y projection lengths (the maximum lengths in the x and y directions, i.e., the root of the sum of the square of the x projection length and square of the y projection length indicates the maximum length) or the area for each unit area, and gives the resulting value to the general controller 8.

As described above, the image processing circuit 28 which is controlled by the general controller 8 provides characteristic values (e.g., centroid coordinates, x/y projection lengths, area, etc.) 62 of the defect candidate portion at the specified coordinates on the subject of inspection (sample 16) which undergoes the projection of electron beam and detection by the electron detector 14.

The general controller 8 converts the coordinates of the defect candidate portion on the objective image into the coordinates on the subject of inspection (sample) 16, removes the pseudo-defect, and finally forms defect data including the position on the subject of inspection (sample) 16 and the characteristic value of each unit area calculated by the defect editor 283 in the image processing circuit 28.

As a variant arrangement, less-than-pixel displacement correcting circuits which correct a displacement below the pixel size between the objective image f3 and relative image g3 based on the displacement values δx0 and δy0 below the pixel size provided by the less-than-pixel displacement detecting circuit 2813 may be provided between the image memories 61a and 61b and the threshold value calculating circuit 2822. In this case, the output of the threshold value calculating circuit 2822 excludes the term A(x,y) from the formulas (5) and (6).

As described above, the table 15 is moved continuously and the deflecting device 12 is activated to cause the electron beam to scan the sample 16 in the direction orthogonal to table moving direction. Secondary electrons, for example, released from the sample 16 are detected by the electron detector 14 and fed to the image slicing circuit 27, which then delivers SEM images successively.

The image processing circuit 28 performs the comparative inspection by comparing the objective electron image without delay with the relative electron image delayed by the delay circuit 278. The amount of delay is set to match with the pattern pitch. Specifically, the amount of delay is derived from the interval of chips (dies) for the comparative inspection of chips (dies) shown in FIG. 8 or derived from the interval of cells for the comparative inspection of cells shown in FIG. 9.

The relative image may be synthesized based on design information, and the inspection of defect can be done based on the comparison with an electron microscope image of a fine circuit pattern formed on a semiconductor wafer or the like.

Although the foregoing explanation is of the case of defect inspection, it is alternatively possible for the image processing circuit 28 to use a reference pattern for the relative image signal g to evaluate the displacement of the objective image signal f, thereby performing the alignment of the objective pattern to the reference pattern by moving the table 15 in response to the evaluated displacement value. It is also possible for the image processing circuit 28 to measure the line width of the objective pattern at a resolution smaller than the pixel size. Specifically, it is possible for a dimension measuring apparatus based on scanning electron microscopic imaging, which is designed to measure the line width and hole diameter of fine circuit patterns in the semiconductor device fabrication process, to carry out the dimensional measurement based on the image processing of the image processing circuit 28.

Next, an embodiment of the inspection of fine patterns and extraneous substances on a sample 16 and the measurement of small pattern widths by the image processing circuit 28 based on an accurate and high-contrast electron image produced by the image slicing circuit 27 by being rid of a noise component created by the UV light irradiation and a displacement caused by charges will be explained.

Figure 10:
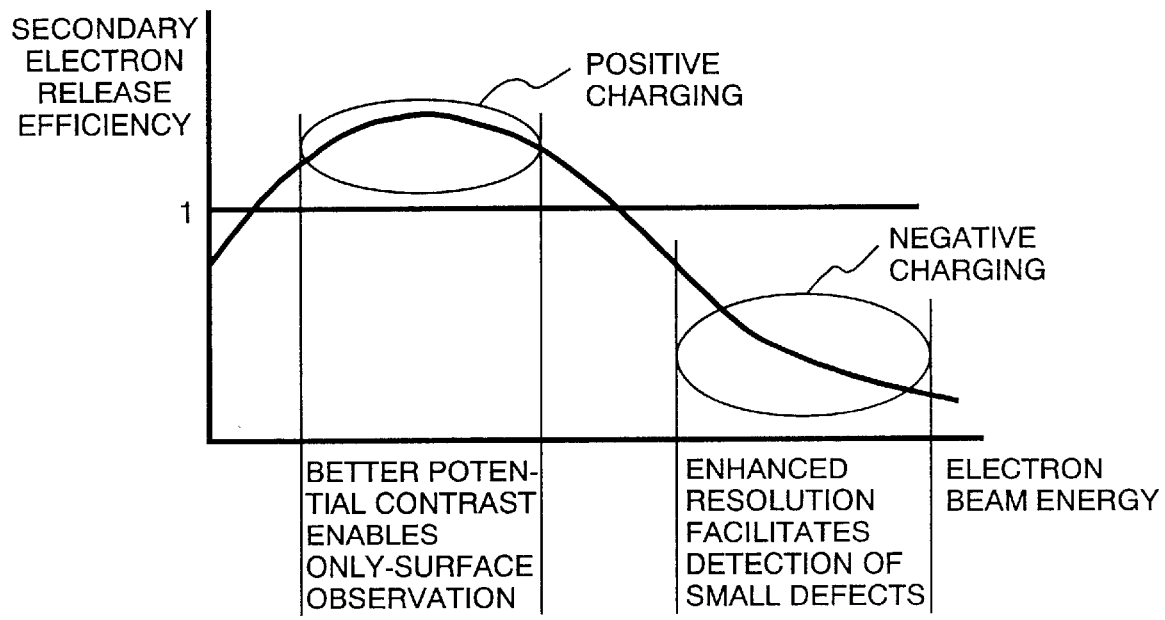
FIG. 10 is a graph showing the relation between the electron beam energy and the secondary electron release efficiency.

Initially, the relation between the electron beam energy and the secondary electron release efficiency will be explained in connection with FIG. 10. In the range of low electron beam energy, the sample is liable to be charged positively at a secondary electron emission efficiency above 1, whereas in the range of high electron beam energy, the sample is liable to be charged negatively at a secondary electron release efficiency below 1.

In the potential contrast mode in which the electrical characteristic of a sample 16 (a subject of inspection on which conductive patterns and insulation patterns mix) is detected as image, the positive charging range at the lower electron beam energy is used preferably, whereas for the detection of small defects by use of a small electron beam diameter, the negative charging range at the higher electron beam energy is used preferably. Namely, by setting a lower electron beam energy to make the secondary electron release efficiency higher than 1, the resulting higher potential contrast facilitates the observation of wiring patterns on the insulator and enables the observation of only the sample surface. Otherwise, by setting a higher electron beam energy to make the secondary electron release efficiency lower than 1, the resulting higher resolution facilitates the detection of small defects. In any case, projecting an electron beam to a sample 16 having insulator, e.g., a semiconductor substrate, charges the sample surface positively or negatively.

In this respect, when a sample 16 having insulator, e.g., a semiconductor substrate, is charged (has a charge-up), the quality of the electron image produced by the electron detector 14 varies, which results in a false comparative inspection or erroneous dimensional measurement. For example, for an electron image 110 shown in FIG. 1A produced in the absence of charge-up, the occurrence of local charge-up causes the electron detector 14 to produce an electron image 111 shown in FIG. 11B having a local variation of contrast, and the occurrence of whole charge-up causes the electron detector 14 to produce an electron image 112 shown in FIG. 11C.

In the case of the comparative inspection of cells, a local contrast variation of the electron image due to charge-up creates the difference of brightness (tone value) between adjacent cells even if they are normal, resulting in a false inspection result. In the case of the comparative inspection of chips (dies), different contrasts among chips (dies) due to local charge-up will result in false inspection results among many chips (dies).

Figure 12A:
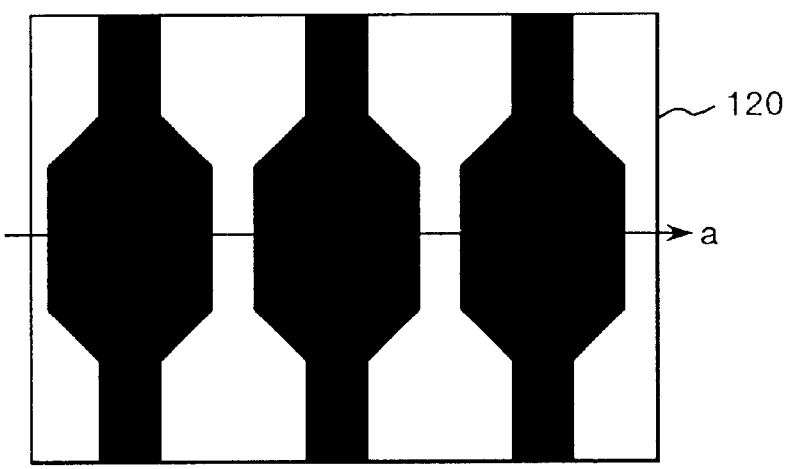
FIG. 12 is a diagram used to explain the variation of pattern dimension due to charge-up, showing an image for the measurement of line width in the absence of charge-up.
Figure 12B:
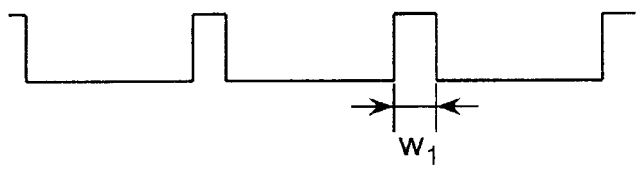

In the case of the dimensional measurement based on electron beam imaging, for example, for an electron image 120 exhibiting a line width W1 shown in FIG. 12 produced in the absence of charge-up, the occurrence of charge-up causes the electron detector 14 to produce an electron image which exhibits a swelled line width W2 as shown in FIG. 13, resulting in a measurement result of an erroneously larger line width W2. In FIG. 12A, FIG. 12B shown by (a) is the electron image 120 in the absence of charge-up, and (b) is the measured line width W1 on the scanning line "a". Similarly, shown by FIG. 13B is the line width W2 on the scanning line "a", which is measured larger erroneously due to charge-up. Different magnification factors at positions due to charge-up exhibits different line widths W3 and W4, which are actually the same, as shown in FIG. 14.

For coping with this matter, the UV light source 31 is activated to emit an exciting UV light of 150 nm or less to the sample 16, e.g., a semiconductor substrate, so as to cover the observation field of electron beam scanning. In the insulation film of $SiO_2$ or $Si_3N_4$ on the sample 16, electrons in the valence band (filled band) are energized to shift to the conduction band so that the electrons contribute to the electrical conduction (electronic conduction), thereby causing charges on the insulation film to flow out to the sample stage 21 having the application of a negative voltage, and the sample 16 is discharged.

In case a conductive wiring pattern exists on the insulation film, it can be used to lead out charges on the insulation film to the sample stage 21 having the application of a negative voltage under the irradiation of UV light of 150 nm or less.

The UV light of 150 nm or less projected to a sample of semiconductor substrate does not damage underlying active elements beneath the insulation film. The wavelength of UV light is selected to have the photoconduction effect and, at the same time, to be harmless to the sample. Accordingly, the wavelength is selected so that the UV light is absorbed at the insulation film surface where charge-up is induced. For example, an insulation film of $SiO_2$ absorbs UV light of around 155 nm or less, and UV light of around 130 nm or less is needed to have the photoconduction effect. In consideration of the fact that the wavelength at which the photoconduction effect emerges varies depending on the composition of $SiO_2$ and the state of UV light irradiation area, UV light of 150 nm or less is used to exert the photoconduction effect on the $SiO_2$ film. An insulation film of $Si_3N_4$ absorbs UV light of around 205 nm or less, and therefore UV light of 200 nm or less is used preferably.

Figure 15:
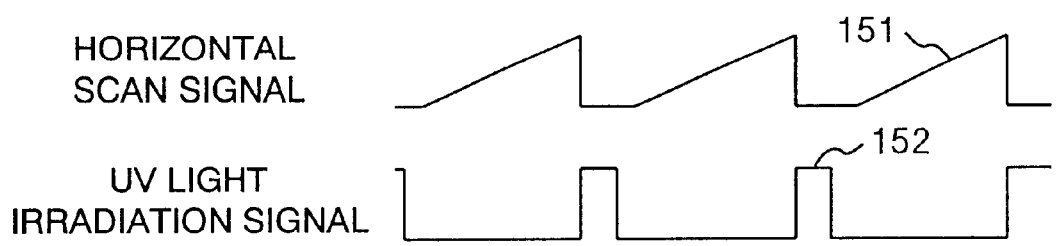
FIG. 15 is a waveform diagram used to explain the irradiation timing of UV light based on a first embodiment controlled by the irradiation controller.

However, the irradiation of UV light 39 of 150 nm or less to the above-mentioned insulation films will create photoelectrons, which will be detected as a noise component by the electron detector 14. On this account, a UV irradiation controller 32 is used so that the UV light 39 (39'), which irradiates the same view field as of the electron beam, does not interfere with the electron beam. Specifically, the UV irradiation controller 32 receives the horizontal scanning signal 151 (particularly the blanking signal included in it) from the scanning controller 18 thereby to produce a UV light irradiation signal 152 as shown in FIG. 15. The signal 152 is used to activate the UV light source 31 during the blanking period or open the shutter means (e.g., a swing mirror) 38 on the UV light path during the blanking period.

Figure 16:
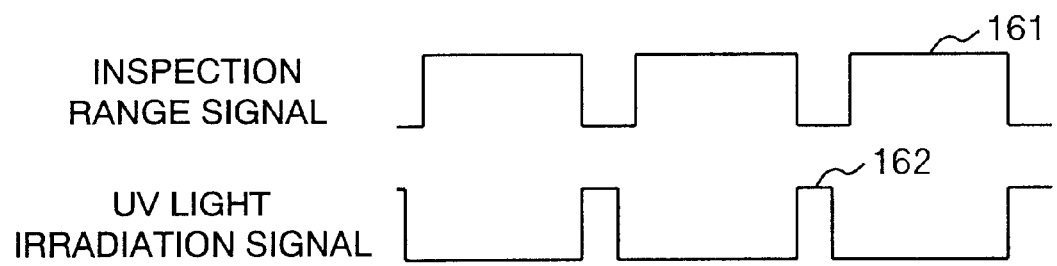
FIG. 16 is a waveform diagram used to explain the irradiation timing of UV light based on a second embodiment controlled by the irradiation controller.

The UV irradiation controller 32 further receives the inspection range signal 161 from the general controller 8 to produce another UV light irradiation signal 162 which is active when the electron beam scans the outside of the inspection area as shown in FIG. 16. The signal 162 is used to activate the UV light source 31 during the period of outer scanning of electron beam or open the shutter means (e.g., a swing mirror) 38 on the UV light path during the period of outer scanning.

The sample 16, e.g., a semiconductor substrate, on the sample stage 21 can possibly have its surface charged during the conveyance outside the chamber. Therefore, the general controller 8 operates on the UV irradiation controller 32 in advance of electron detection to activate the UV light source 31 or open the shutter means (e.g., a swing mirror) 38 on the UV light path thereby to make the insulation film of the sample 16 conductive by the irradiation of UV light 39 (39') so that accumulated charges flow out to the sample stage 21.

Figure 17A:
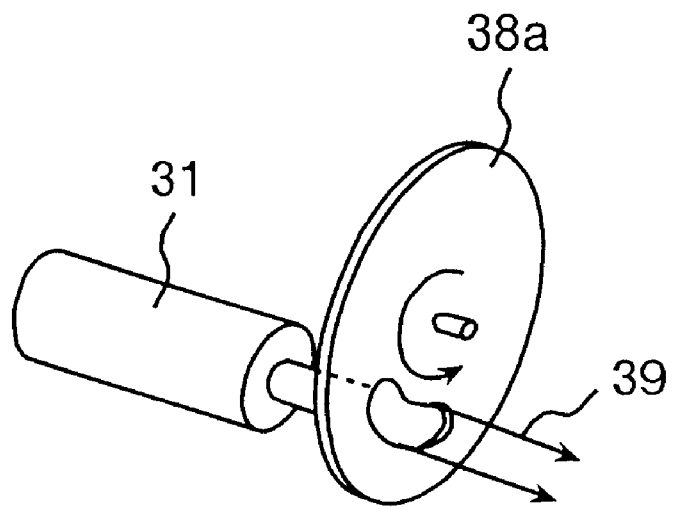
FIGS. 17A and 17B are diagrams showing an embodiment of the shutter means equipped on the UV light source shown in FIG. 1.

FIG. 17A shows a first embodiment 38a of the shutter means 38 which manipulates the irradiation of UV light 39. This shutter means 38a is principally a rotary disc having a window which transmits the UV light 39. The rotary disc is driven to rotate in synchronism with the blanking signal for example, so that the UV light 39 is projected to the sample 16 during the blanking period.

Figure 17B:
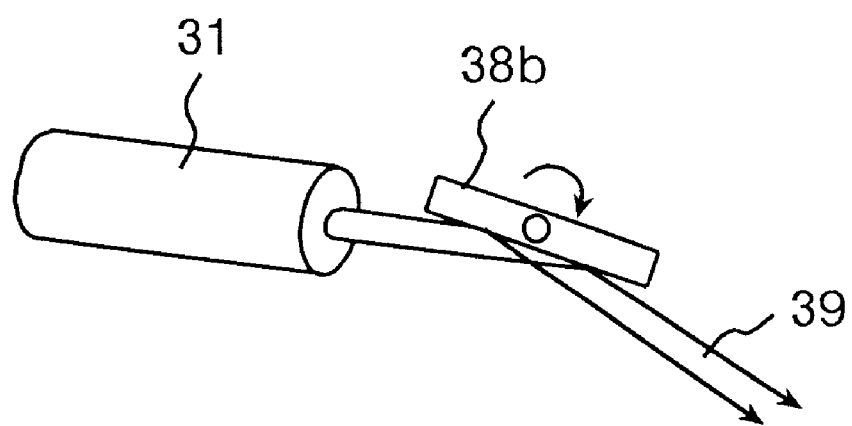

FIG. 17B shows a second embodiment 38b of the shutter means 38 which manipulates the irradiation of UV light 39. This shutter means 38b is principally a swing mirror, which is driven to swing back and forth so that the UV light 39 is deflected off the inspection range of the sample 16 during the scanning of the electron beam across the range and it is brought back to the inspection range when the electron beam scans the outside of the range. The use of the swing mirror enables a linear UV light 39 to scan across the sample 16 so that a strip area on the insulation film is made conductive sequentially in virtually the same manner as the case of the projection of a slit beam of UV light 39'.

Figure 18A:
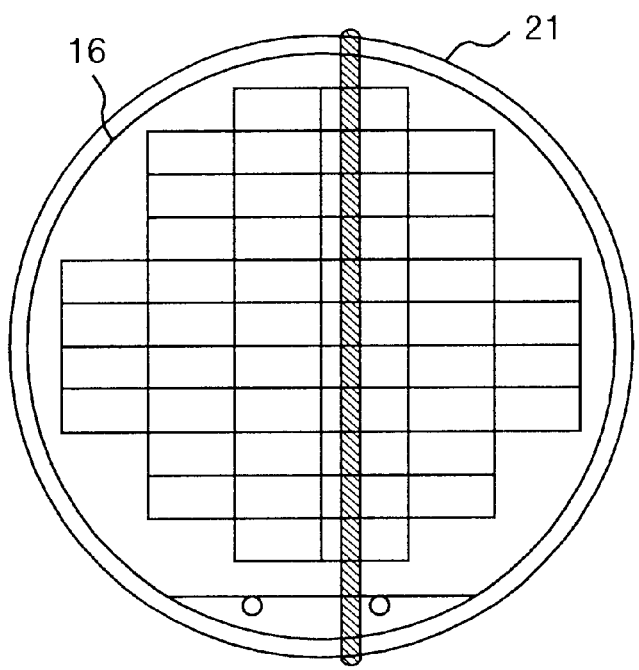
FIGS. 18A and 18B are diagrams explaining an embodiment of the UV light irradiation optical system which projects a slit beam of UV light to a sample.
Figure 18B:
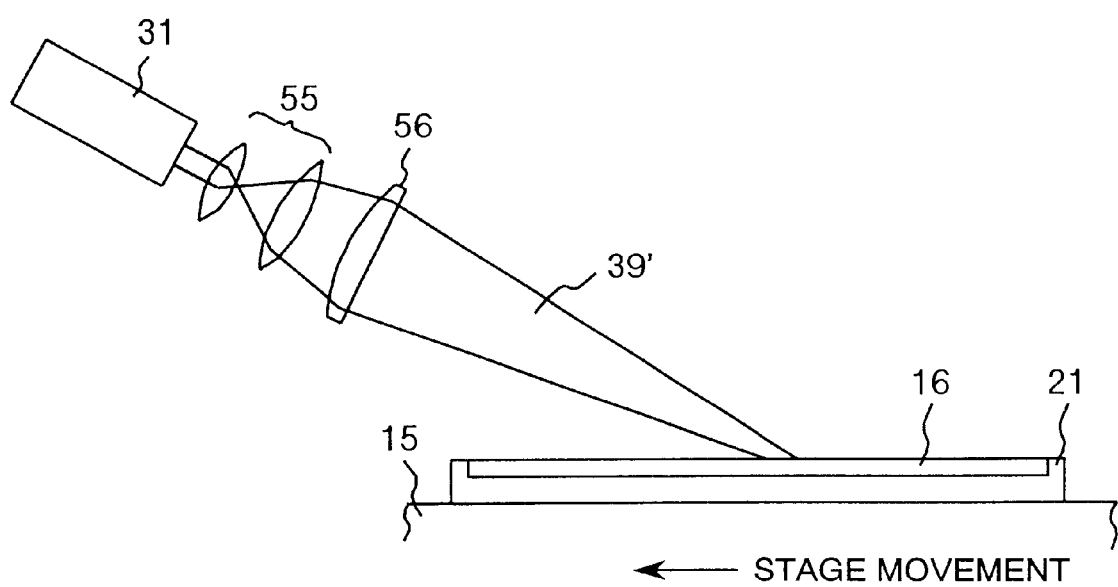

FIGS. 18A and 18B show the optical system for projecting a slit beam of UV light 39' which extends across the sample stage 21, and the irradiation of the semiconductor substrate 16 with this UV slit light 39'. Specifically, in FIG. 18B, the UV light beam emitted by the UV light source 31 is expanded by an expander 55 which is a lens made of $MgF_2$, LiF, etc., and converged into a slit beam by a cylindrical lens 56 made of $MgF_2$, LiF, etc. so that the resulting UV slit light 39' irradiates the semiconductor substrate 16 across the sample stage 21 which has the application of a negative voltage. This UV optical system enables charges on the insulation film in the central portion of the semiconductor substrate 16 to flow out quickly to the sample stage 21. In the case of the presence of a wiring pattern formed on the insulation film, this UV optical system alleviates the need of leading out charges on the insulation film through the wiring pattern, and it also reduces the damage to underlying active elements.

It is also possible to combine the optical system shown in FIGS. 17A and 17B for turning on and off the UV irradiation and the UV optical system shown in FIGS. 18A and 18B.

As described above, based on the irradiation of UV light 39 (39') during the blanking period of horizontal scanning of the electron beam as shown in FIG. 15 or during the electron beam scanning in the inspection unneedful area on the sample 16 as shown in FIG. 16, it becomes possible for the electron detector 14 to produce an electron image which is rid of the influence of photoelectrons and relieved of charge-up. In consequence, even for a sample having its image quality varied by charge-up, it is possible to carry out a stable inspection or measurement based on electron beam imaging by the irradiation of UV light during the idling period of electron beam imaging or analysis.

Figure 19A:
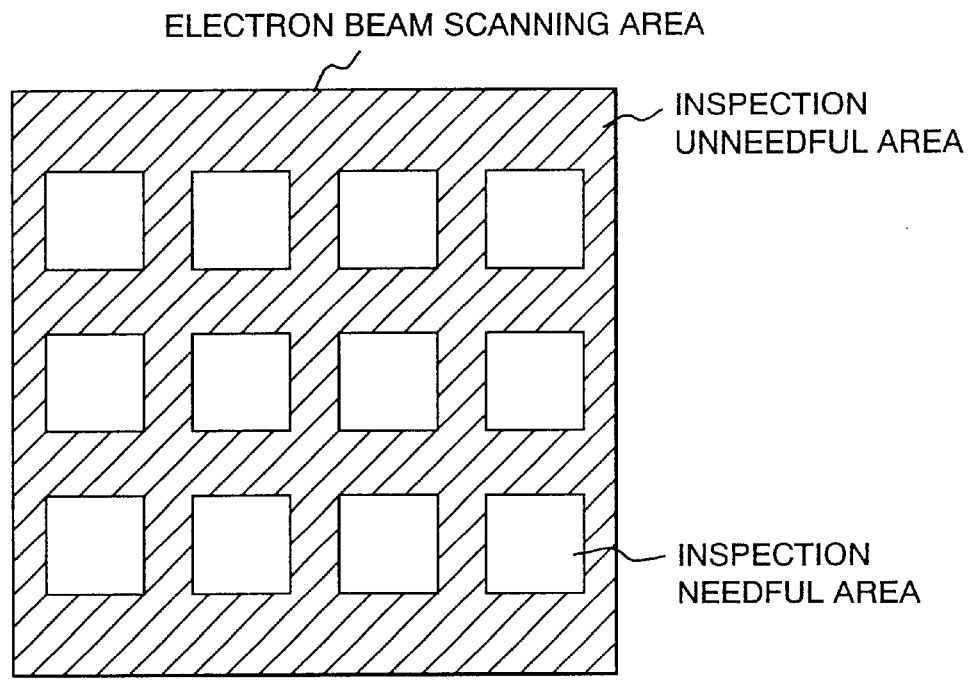
FIGS. 19A and 19B are diagrams showing the UV light irradiation area in contrast to the electron beam scanning area on the sample.
Figure 19B:
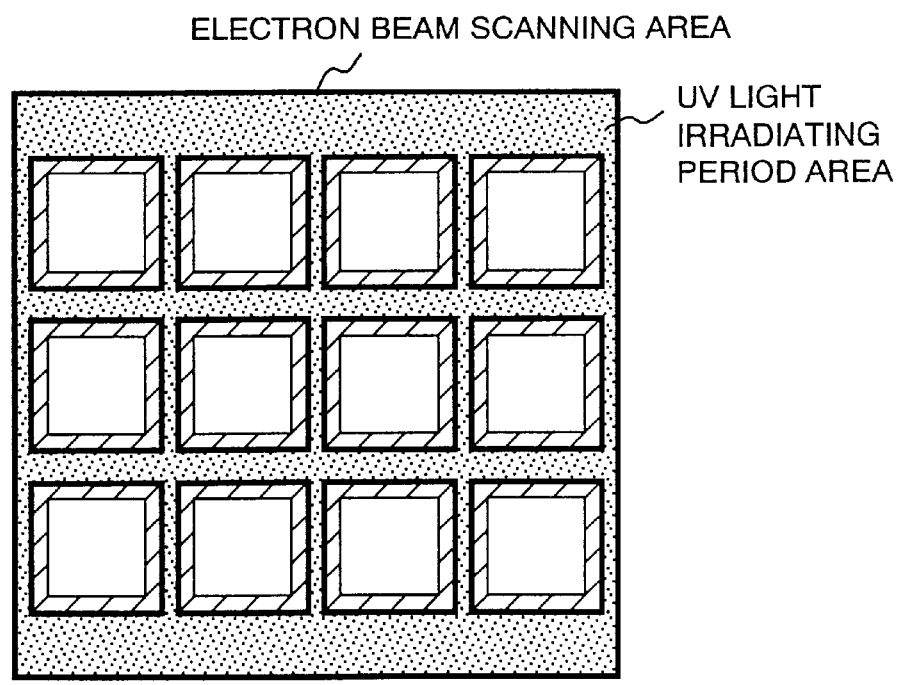

In the case of UV light irradiation only during the electron beam scanning in the inspection unneedful area, the UV light 39 (39') may not be projected to the portions of inspection unneedful area near the inspection needful area during the electron beam scanning period as shown in FIG. 19B. FIG. 19A shows the inspection needful area and inspection unneedful area in the electron beam scanning area on the sample 16, and FIG. 19B shows the period of UV irradiation in the period of electron beam scanning. These inspection needful area and inspection unneedful area are established by the general controller 8 based on the design information of the sample 16, e.g., a semiconductor substrate, entered by an input means 35 including a network linked with a CAD system or a recording medium and stored in the memory 36.

If the detailed analysis of a sample by use of the electron beam apparatus is intended, the sample is inspected for defects in advance with an optical microscope or the like and the resulting coordinate data of the defects is entered through the input means 35 including a network or recording medium to the electron beam apparatus, in which the general controller 8 establishes inspection needful areas to be analyzed in accordance with the coordinate data of the defects. The general controller 8 analyzes defect information edited by the image processing circuit 28 for the inspection needful areas stored in the memory 36. The general controller 8 supplies the data of inspection needful areas read out of the memory 36 to the image processing circuit 28, which then edits and/or analyzes the defect information.

In regard to the UV light source 31, if it necessitates pumping at an interval of 10–50 μs, for example, and has its emitted UV light intensity varying periodically, as in the case of an a.c. excimer lamp for example, the scanning controller 18 is designed to quit blanking and project the scanning electron beam across the inspection/measurement area on the sample 16 during the period Te of lower UV emission of the UV light source 31 as shown in FIG. 20 informed by the general controller 8 or irradiation controller 23, and operate on the electron detector 14 to produce an electron image in this period, whereby it is possible to produce an electron image which is rid of the influence of photoelectrons created by the UV light irradiation and relieved of charge-up.

Accordingly to the foregoing embodiments of invention, the image slicing circuit 27 produces an accurate and high-contrast electron image without a charge-causing displacement based on the irradiation of UV light during the period when the scanning electron beam is not projected to the inspection needful areas. In consequence, the image processing circuit 28 implements the stable and accurate inspection or measurement of a sample.

In addition, a slit beam of UV light 39' as shown in FIG. 18 (inclusive of the scanning of linear UV light beam by means of a swing mirror 38b as shown in FIG. 17B) is deflected to follow closely the scanning line of electron beam (which is virtually orthogonal to the moving direction of the table 15) on the sample 16 which is moved by the table 15, while activating the UV irradiation in the outside of the view field of the electron detector 14 (outside of the scanning area of the electron beam which is deflected by the deflecting device 12 on the sample 16), thereby making the insulation film conductive so that charges flow out and preventing the electron detector 14 from detecting photoelectrons created by the irradiation of UV light.

Namely, it is intended to have the UV light irradiation by the UV irradiation optical system (31, 55, 56, 38b) positioned in the outside of the view field of the electron detector 14 and located as near as the electron beam axis (electron beam scanning line). Based on this arrangement, each position of the insulation film which has been charged by the projection of scanning electron beam becomes conductive, causing charges to flow out subsequently as the table 15 moves.

The insulation film is prevented from being charged by the projection of scanning electron beam and the electron detector 14 is prevented from detecting photoelectrons created by the UV light irradiation and enabled to produce a high-contrast electron image without distortion, and consequently the high-sensitivity and high-reliability defect inspection and dimensional measurement of fine patterns can be accomplished.

Next, an embodiment for producing an electronic image which is free from the influence of photoelectrons created by the UV light irradiation and is relieved of charge-up due to the UV light irradiation based on the function of the preprocessing circuit 276 in the image slicing circuit 27 will be explained.

In case the UV light source 31 emits an exciting UV light of 150 nm or less stably without a time-wise fluctuation, as in the case of using a d.c. excimer lamp for example, created photoelectrons merely causes a small offset in the electronic image produced by the electron detector 14, and by removing this offset as a dark level by the dark level correcting circuit 2761 shown in FIG. 3, an electronic image without charge-up can be obtained by the preprocessing circuit 276 without the need of aftercare of UV light emission by the UV light source 31. In consequence, the stable and accurate inspection or measurement based on electron beam imaging can be implemented by the preprocessing circuit 276.

Figure 22:
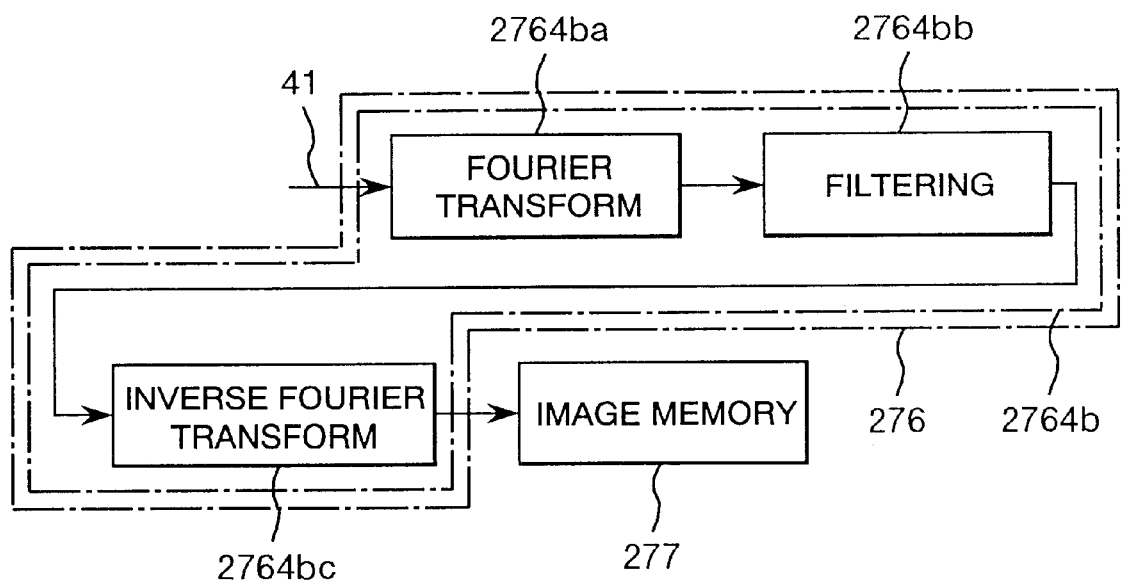
FIG. 22 is a block diagram used to explain an embodiment for removing a noise component created by the irradiation of UV light with frequency fu from the detected electron image signal based on the Fourier transformation, filtering, and inverse Fourier transformation.

In case the UV light source 31 has a constant light emitting period (fu), as in the case of using an a.c. excimer lamp or excimer laser for example, the filtering processing circuit 2764 of the preprocessing circuit 276 uses a notch filter 2764a to cut off the emission frequency (fu) as shown in FIG. 21, or the filtering processing circuit 2764 uses a filter circuit 2764b including a Fourier transform circuit 2764ba, filtering circuit 2764bb, and inverse Fourier transform circuit 2764bc as shown in FIG. 22 to cut off the emission frequency (fu). In consequence, an electron image which is rid of the influence of photoelectrons created by the UV light irradiation and rid of charge-up can be obtained by the preprocessing circuit 276, while using intact the UV light of continuous emission at the constant frequency by the UV light source 31.

Next, an embodiment for the prevention of contamination and charge-up of the barrel interior thereby to prevent the fluctuation of the electron beam position, focal position and astigmatism with the intention of improving the accuracy of inspection or measurement based on electron beam imaging will be explained. Specifically, this embodiment is the provision of a UV light projection system 30 which projects a UV light beam into the barrel in order to protect the barrel interior against the contamination and charge-up as shown in FIG. 1. The UV light projection system 30 is controlled by the UV irradiation controller 32 under control of the general controller 8.

Figure 23:
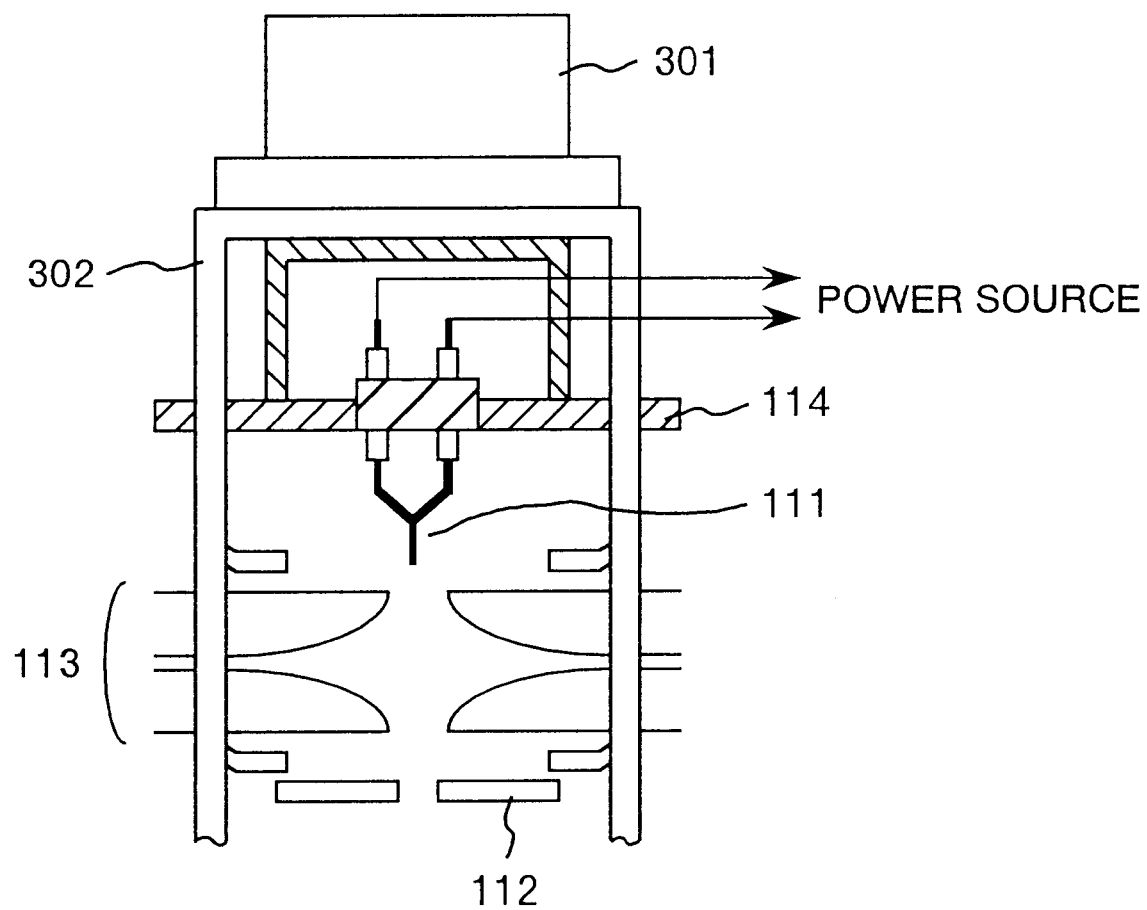
FIG. 23 is a diagram showing an embodiment of arrangement, which is different from the arrangement of FIG. 1, of an electron beam apparatus which is designed to irradiate the barrel interior with a UV light.

FIG. 23 shows a specific arrangement of the UV light projection system 30. The UV light projection system 30 projects a UV light directly in the lateral direction into the barrel 2 in FIG. 1, whereas in the arrangement of FIG. 23, a UV light from a UV light source 301 is projected by means of an optical fiber or light transmitting glass rod 302 to the intended parts including the electron gun 111 and aperture section (of the drawing electrode and blanking electrode) 112. Indicated by 113 is a condenser lens for converging the electron beam from the electron gun 111, and 114 is a bracket of electron gun 111, which is connected to a power source.

The electron gun 111 having the UV light projection enhances the electron beam emission efficiency, by which the improvement of intensity can be expected. The aperture section 112 having the UV light projection is protected against charge-up which is caused by the burn of aperture (turning into insulation substance) by the electron beam. An alternative manner of UV light projection to the intended area is the use of a mirror or the like instead of the optical fiber or glass rod 302.

As described above, based on the UV light projection into the barrel by the UV light projection system 30 it becomes possible to prevent the contamination and charge-up of the barrel interior so that the fluctuation of the electron beam position, focal position and astigmatism is prevented, whereby it becomes possible to improve the accuracy of inspection and dimensional measurement of a sample based on electron beam imaging.

Although the foregoing embodiments employ the electron beam apparatus, the objective of the present invention can also be achieved by use of other converged charged-particle beam apparatus, e.g., a converged ion beam apparatus, in which case the electron beam source 11 is replaced with an ion source and the electron detector 14 is replaced with a charged-particle detector.

The inventive method and apparatus are designed to irradiate a sample with a UV light so that the insulation film on the sample is prevented from being charged, and yet are capable of producing an accurate and high-contrast charged-particle image without including a noise component created by the UV light irradiation, whereby the high-sensitivity and high-reliability small defect inspection or dimensional measurement of fine patterns on a sample can be accomplished.

The inventive method and apparatus are designed to irradiate a sample, e.g., a semiconductor substrate, with a UV light, while minimizing the damage to underlying elements beneath the insulation film of $SiO_2$, $Si_3N_4$, etc., so that the insulation film on the sample is prevented from being charged, and yet are capable of producing an accurate and high-contrast charged-particle image without including a noise component created by the UV light irradiation, whereby the high-sensitivity and high-reliability small defect inspection or dimensional measurement of fine patterns on a sample can be accomplished.

The inventive charged-particle beam apparatus, e.g., an electron beam apparatus, is capable of preventing the fluctuation of the electron beam position, focal position and astigmatism caused by charge-up of the barrel interior of the apparatus, whereby the high-sensitivity and high-reliability small defect inspection or dimensional measurement of fine patterns on a sample can be accomplished.

The inventive charged-particle beam apparatus, e.g., an electron beam apparatus, operates efficiently based on the enhancement of the efficiency of emission of a charged-particle beam from a beam source, e.g. an electron gun, in the barrel of the apparatus.

The invention may be embodied in other specific forms without departing from the spirit or essential characteristics thereof. The present embodiment is therefor to be considered in all respects as illustrative and not restrictive, the scope of the invention being indicated by the appended claims rather than by the foregoing description and all changes which come within the meaning and range of equivalency.

What is claimed is:

1. A method of inspecting or measuring a sample using a charged-particle beam image comprising:
    an inspecting or measuring step of scanning, while irradiating, a converged charged-particle beam on a sample at least partially covered with an insulation film, detecting charged-particles which are released from the sample due to the irradiation and scanning of the charged-particle beam, thereby producing a charged-particle image, and processing the produced charged-particle image, thereby performing either an inspection or measurement of a pattern formed on the sample by comparing the produced charged-particle image with an image stored in a memory; and
    a conduction rendering step of irradiating the sample with a UV light to energize electrons in the insulation film of the sample so as to make the insulation film conductive, thereby causing charges to flow out of the sample.

2. An inspecting or measuring method using a charged-particle beam image according to claim 1, wherein the period of irradiation and scanning of the charged-particle beam to the inspection or measurement area of the sample is different from the period of UV light irradiation of the sample.

3. An inspecting or measuring method using a charged-particle beam image according to claim 1, wherein the period of UV light irradiation of the sample in said conduction rendering step is timed to the outside of the period of irradiation and scanning of the charged-particle beam to the sample in said inspecting or measuring step.

4. An inspecting or measuring method using a charged-particle beam image according to claim 1, wherein the irradiation of the sample with the UV light in said conduction rendering step is implemented outside of the period of irradiation and scanning of the charged-particle beam to the sample.

5. An inspecting or measuring method using a charged-particle beam image according to claim 1, wherein the irradiation of the sample with the UV light in said conduction rendering step is implemented at virtually a constant intensity of UV light.

6. An inspecting or measuring method using a charged-particle beam image according to claim 1, wherein said inspecting or measuring step implements the image processing by removing from the produced charged-particle image a noise component created by the UV light irradiation.

7. An inspecting or measuring method using a charged-particle beam image according to claim 1, wherein said conduction rendering step varies the intensity of UV light irradiation of the sample periodically, and said inspecting or measuring step implements said image processing by removing from the produced charged-particle image a noise component created by the UV light irradiation.

8. An inspecting or measuring method using a charged-particle beam image according to claim 1, wherein the area of UV light irradiation on the sample in said conduction rendering step is outside of the imaging field of the charged-particle image of the sample in said inspecting or measuring step.

9. An inspecting or measuring method using a charged-particle beam image according to claim 1, wherein the UV light for the irradiation of the sample in said conduction rendering step has a wavelength of 200 nm or less.

10. An inspecting or measuring method using a charged-particle beam image comprising the steps of:
    irradiating and scanning a converged charged-particle beam on a sample at least partially covered with an insulation film;
    detecting charged-particles which are released from the sample due to the irradiation and scanning of the charged-particle beam, thereby producing a charged-particle image;
    processing the produced charged-particle image, thereby performing either an inspection or measurement of a pattern formed on the sample by comparing the produced charged-particle image with an image stored in a memory; and
    irradiating the sample with a UV light to energize electrons in the insulation film of the sample, thereby making the insulation film conductive.

11. An inspecting or measuring method using a charged-particle beam image according to claim 10, wherein the timing of irradiation and scanning of the charged-particle beam to the inspection or measurement area of the sample is different from the timing of UV light irradiation of the sample.

12. An inspecting or measuring method using a charged-particle beam image according to claim 10, wherein said inspecting or measuring step implements the image processing by removing from the produced charged-particle image a noise component created by the UV light irradiation.

13. An inspecting or measuring method using a charged-particle beam image according to claim 10, wherein the area of UV light irradiation on the sample in said conduction rendering step is outside of the imaging field of the charged-particle image of the sample in said inspecting or measuring step.

14. An inspecting or measuring method using a charged-particle beam image according to claim 10, wherein the UV light for the irradiation of the sample has a wavelength of 200 nm or less.

15. An apparatus for inspecting or measuring a sample using a charged-particle beam image comprising:
   a stage for placing of a sample having an insulation film;
   a charged-particle source;
   a charged-particle beam focusing system which converges a charged-particle beam emitted by said charged-particle source;
   a scanning unit which deflects the charged-particle beam converged by said charged-particle beam focusing system to irradiate and scan the charged-particle beam to the sample placed on said stage;
   an imaging unit which detects charged-particles released from the sample due to the irradiation and scanning of the charged-particle beam by said scanning unit, thereby producing a charged-particle image;
   an image processing unit which processes the charged-particle image produced by said imaging unit, thereby performing either an inspection or measurement of a pattern formed on the sample by comparing the produced charged-particle image with an image stored in a memory; and
   UV light irradiation unit which irradiates the sample with a UV light to energize electrons in the insulation film of the sample, thereby making the insulation film conductive.

16. An inspecting or measuring apparatus using a charged-particle beam image according to claim 15, wherein said image processing unit compares the charged-particle image with a reference charged-particle image which is stored in said memory, thereby performing the inspection or measurement of the sample.

17. An inspecting or measuring apparatus using a charged-particle beam image according to claim 15 further including control unit which controls the timing of UV light irradiation of the sample by said UV light irradiation unit and the timing of irradiation of the charged-particle beam to the sample by said scanning unit.

18. An inspecting or measuring apparatus using a charged-particle beam image according to claim 17, wherein said control unit controls said UV light irradiation unit to irradiate the sample during a period which is different from the period of irradiation and scanning of the charged-particle beam to the sample by said scanning unit.

19. An inspecting or measuring apparatus using a charged-particle beam image according to claim 15, wherein said image processing unit includes a noise eliminator which removes a noise component created by the UV light irradiation from the charged-particle image produced by said imaging unit.

20. An inspecting or measuring apparatus using a charged-particle beam image according to claim 15, wherein said UV light irradiation unit irradiates the outside of the imaging field of said imaging unit on the sample.

21. An inspecting or measuring apparatus using a charged-particle beam image according to claim 15, wherein said UV light irradiation unit irradiates the sample with a UV light having a wavelength of 200 nm or less.

22. A charged-particle beam apparatus comprising:
   a stage for placing a sample;
   a charged-particle source;
   a charged-particle beam focusing system which converges a charged-particle beam emitted by said charged-particle source;
   a scanning unit which deflects the charged-particle beam converged by said charged-particle beam focusing system to irradiate and scan the charged-particle beam to the sample placed on said stage;
   a detector which detects charged-particles released from the sample due to the irradiation and scanning of the charged-particle beam;
   an imaging unit which produces a charged-particle image of the sample using a signal of charged-particles detected by said detector;
   a barrel unit which accommodates said stage, said charged-particle source, said charged-particle beam focusing system, said scanning unit, and said detector; and
   a UV light projection unit which projects a UV light to the interior of said barrel unit.

23. A charged-particle beam apparatus according to claim 22, wherein said UV light projection unit projects the UV light to the interior of said barrel unit, thereby discharging or cleaning the barrel interior.

24. A charged-particle beam apparatus according to claim 22, wherein said UV light projection unit projects the UV light to said charged-particle source.

25. A charged-particle beam apparatus according to claim 22, wherein said UV light projection unit projects the UV light to said scanning unit.

* * * * *